(12) United States Patent
Fukusumi

(10) Patent No.: US 12,227,848 B2
(45) Date of Patent: Feb. 18, 2025

(54) SUBSTRATE PROCESSING APPARATUS, METHOD FOR PROCESSING SUBSTRATE, AND METHOD FOR MANUFACTURING SEMICONDUCTOR DEVICE

(71) Applicant: Kioxia Corporation, Tokyo (JP)

(72) Inventor: Takanori Fukusumi, Kuwana (JP)

(73) Assignee: Kioxia Corporation, Tokyo (JP)

( * ) Notice: Subject to any disclaimer, the term of this patent is extended or adjusted under 35 U.S.C. 154(b) by 640 days.

(21) Appl. No.: 17/445,736

(22) Filed: Aug. 24, 2021

(65) Prior Publication Data
US 2022/0243337 A1 Aug. 4, 2022

(30) Foreign Application Priority Data

Jan. 29, 2021 (JP) ................................. 2021-013340

(51) Int. Cl.
*C23C 18/06* (2006.01)
*H01L 21/02* (2006.01)
*H01L 21/027* (2006.01)

(52) U.S. Cl.
CPC ........ *C23C 18/06* (2013.01); *H01L 21/02282* (2013.01); *H01L 21/0273* (2013.01)

(58) Field of Classification Search
CPC .................................................. C23C 18/1603
See application file for complete search history.

(56) References Cited

U.S. PATENT DOCUMENTS

| 4,822,639 | A | * | 4/1989 | Fujii | C03C 17/002 |
| | | | | | 438/782 |
| 7,833,912 | B2 | * | 11/2010 | Kobayashi | H01L 21/0274 |
| | | | | | 430/327 |
| 9,027,508 | B2 | | 5/2015 | Hatakeyama et al. | |
| 10,002,770 | B2 | * | 6/2018 | Izumoto | H01L 21/67028 |
| 11,033,929 | B2 | | 6/2021 | Fujiwara | |
| 2006/0177597 | A1 | * | 8/2006 | Ebisawa | B41M 5/0017 |
| | | | | | 118/313 |
| 2007/0065145 | A1 | * | 3/2007 | Kitamura | G03F 7/3021 |
| | | | | | 396/611 |
| 2007/0254463 | A1 | * | 11/2007 | Kobayashi | H01L 21/0274 |
| | | | | | 257/449 |

(Continued)

FOREIGN PATENT DOCUMENTS

CN 105935647 A 9/2016
JP 2007-299960 A 11/2007
(Continued)

*Primary Examiner* — William A Harriston
(74) *Attorney, Agent, or Firm* — Oblon, McClelland, Maier & Neustadt, L.L.P.

(57) ABSTRACT

A substrate processing apparatus includes: a rotation support table capable of supporting and rotating a substrate; a chemical liquid nozzle that is arranged above an outer edge portion of the substrate that is supported by the rotation support table, and through which a chemical liquid is applied to the outer edge portion; and a solidified film forming unit that is arranged at least either on an upper side or on a lower side of the outer edge portion of the substrate that is supported by the rotation support table, and on a downstream side, in a direction of rotation of the substrate, of a position where the chemical liquid nozzle is arranged, and solidifies the chemical liquid applied to the outer edge portion, to form a solidified film that forms a part of an annular film.

2 Claims, 13 Drawing Sheets

(56) References Cited

U.S. PATENT DOCUMENTS

| | | | |
|---|---|---|---|
| 2008/0008835 A1 | 1/2008 | Terada et al. | |
| 2008/0035610 A1* | 2/2008 | Miya | H01L 21/6708 216/84 |
| 2008/0142054 A1* | 6/2008 | Eitoku | H01L 21/67051 134/30 |
| 2014/0154890 A1* | 6/2014 | Hatakeyama | H01L 21/6715 118/695 |
| 2014/0261570 A1* | 9/2014 | Orii | H01L 21/02052 134/144 |
| 2014/0283747 A1 | 9/2014 | Kasai et al. | |
| 2016/0372340 A1* | 12/2016 | Takeaki | H01L 21/6708 |
| 2018/0133748 A1 | 5/2018 | Fujiwara | |
| 2019/0088469 A1* | 3/2019 | Tanaka | B08B 3/10 |
| 2020/0025692 A1 | 1/2020 | Hisano et al. | |

FOREIGN PATENT DOCUMENTS

| | | |
|---|---|---|
| JP | 2014-233704 A | 12/2014 |
| JP | 5682521 B2 | 3/2015 |
| JP | 5779168 B2 | 9/2015 |
| JP | 2018-147965 A | 9/2018 |
| TW | 201830467 A | 8/2018 |

\* cited by examiner

FIG.5

| RECIPE NAME | TURNTABLE | | | CHEMICAL LIQUID NOZZLE | | GAS NOZZLE | | | | 61 |
|---|---|---|---|---|---|---|---|---|---|---|
| | START | END | ROTA-TIONS PER MINUTE | START | END | START | END | TEM-PERA-TURE | | ... |
| ------ | ---- | ---- | ---- | ---- | ---- | ---- | ---- | ---- | | ... |
| ------ | ---- | ---- | ---- | ---- | ---- | ---- | ---- | ---- | | |
| ------ | ---- | ---- | ---- | ---- | ---- | | | | | |
| ------ | ---- | ---- | ---- | ---- | ---- | ---- | ---- | ---- | | |
| ------ | ---- | ---- | ---- | ---- | ---- | ---- | ---- | ---- | | ... |
| ------ | ---- | ---- | ---- | ---- | ---- | ---- | ---- | ---- | | |
| ------ | ---- | ---- | ---- | ---- | ---- | | | | | |
| ------ | ---- | ---- | ---- | ---- | ---- | ---- | ---- | ---- | | |

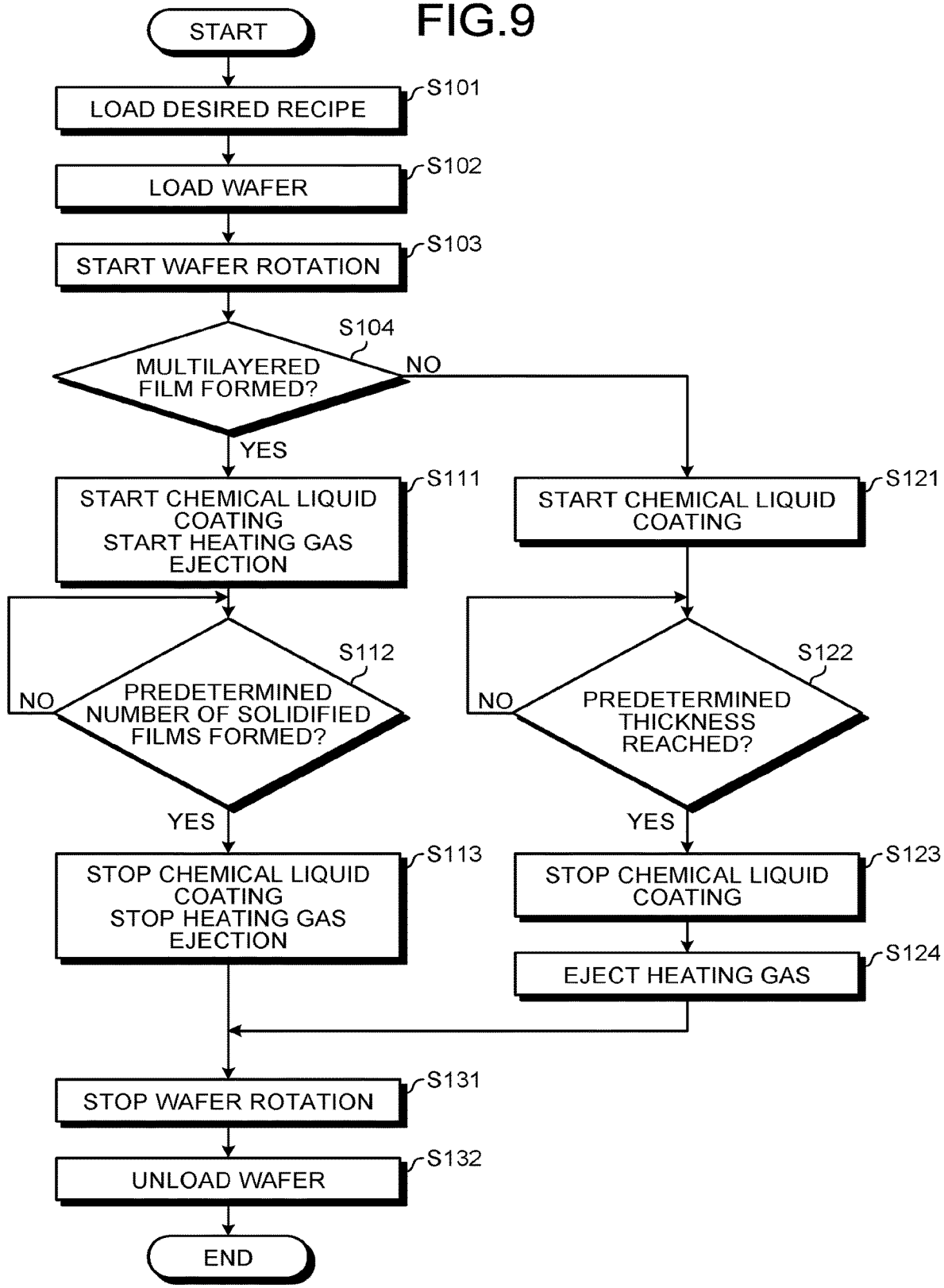

SUBSTRATE PROCESSING APPARATUS, METHOD FOR PROCESSING SUBSTRATE, AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2021-013340, filed on Jan. 29, 2021; the entire contents of which are incorporated herein by reference.

FIELD

Embodiments described herein relate generally to a substrate processing apparatus, a method for processing a substrate, and a method for manufacturing a semiconductor device.

BACKGROUND

In a process of manufacturing a semiconductor device, some cases need application of a chemical liquid to an outer edge portion of a substrate, to form an annular film. Thickness of the film is preferably controllable depending on purposes of formation of the film. Formation of the film with varied thickness will, however, need chemical liquids with a variety of viscosities loaded on a substrate processing apparatus for applying the chemical liquids; or a process of applying a chemical liquid with the substrate processing apparatus, and a process of baking by using some other unit in the apparatus or outside the apparatus, which are repeated until a desired film thickness is reached.

BRIEF DESCRIPTION OF THE DRAWINGS

FIG. 5 is a drawing illustrating an exemplary recipe table owned by the substrate processing apparatus according to the first embodiment;

FIG. 9 is a flow chart illustrating an exemplary procedure of substrate processing according to the first embodiment;

DETAILED DESCRIPTION

Figure 1:
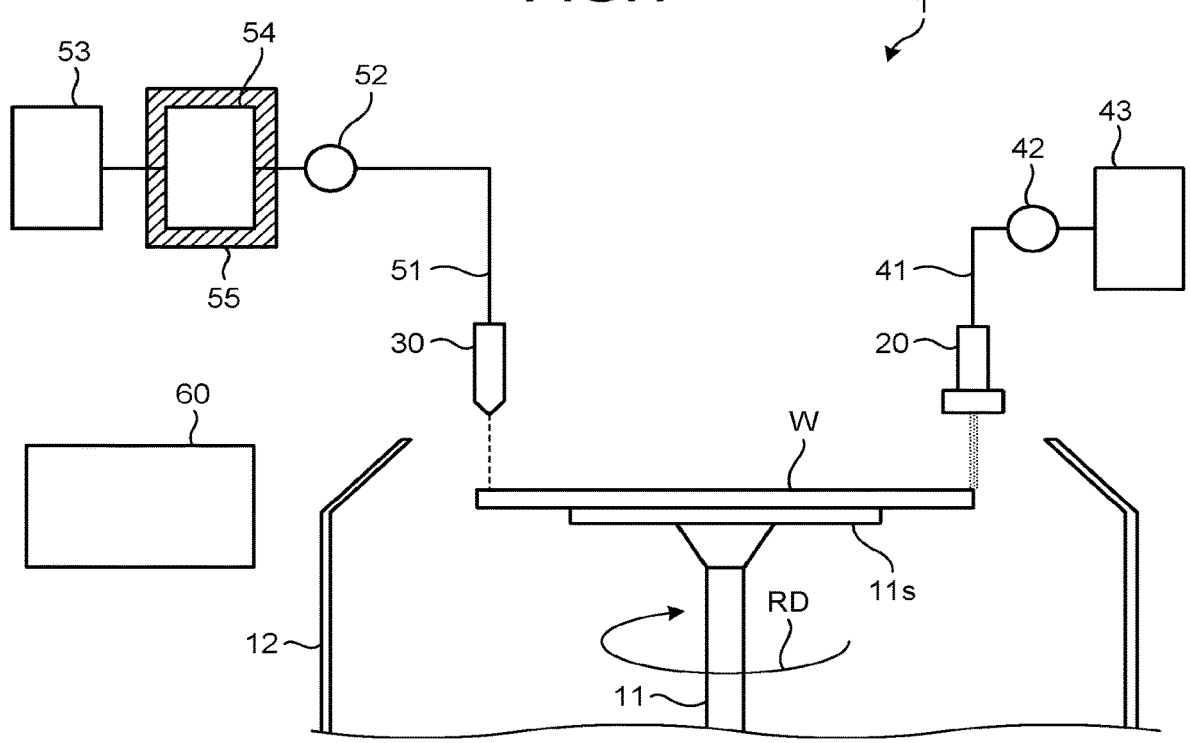
FIG. 1 is a drawing illustrating an exemplary structure of a substrate processing apparatus according to a first embodiment.

A substrate processing apparatus according to an embodiment is a substrate processing apparatus for forming an annular film on an outer edge portion of a substrate, the substrate processing apparatus includes: a rotation support table capable of supporting and rotating the substrate; a chemical liquid nozzle that is arranged above the outer edge portion of the substrate that is supported by the rotation support table, and through which a chemical liquid is applied to the outer edge portion; and a solidified film forming unit that is arranged at least either on an upper side or on a lower side of the outer edge portion of the substrate that is supported by the rotation support table, and on a downstream side, in a direction of rotation of the substrate, of a position where the chemical liquid nozzle is arranged, and solidifies the chemical liquid applied to the outer edge portion, to form a solidified film that forms a part of the annular film.

Hereinafter, the present invention will be detailed referring to the drawings. Note that the present invention is not limited by the following embodiments. In addition, constituents in the following embodiments include those that would be easily conceived by a person skilled in the art, or those that are substantially the same.

First Embodiment

Hereinafter, a first embodiment will be detailed referring to the attached drawings.

Exemplary Structure of Substrate Processing Apparatus

FIG. 1 is a drawing illustrating an exemplary structure of a substrate processing apparatus 1 according to the first embodiment. The substrate processing apparatus 1 of the first embodiment is given typically in the form of a chemical liquid coater that forms an annular film on an outer edge portion of a wafer W.

As illustrated in FIG. 1, the substrate processing apparatus 1 has a turntable 11, a cup 12, a chemical liquid nozzle 20, a gas nozzle 30, feed tubes 41 and 51, valves 42 and 52, a chemical liquid tank 43, a gas tank 53, a gas reservoir 54, a heating unit 55, and a control unit 60.

The turntable 11 as the rotation support table supports and rotates the wafer W as the substrate. That is, the turntable 11 has a stage 11s capable of holding the wafer W. The turntable 11 also has an unillustrated rotary motor and so forth. The rotary motor rotates the stage 11s with the wafer W held thereon.

The chemical liquid nozzle 20 is arranged above the outer edge portion of the wafer W that is supported on the turntable 11, and through which the chemical liquid is applied to the outer edge portion of the wafer W. The chemical liquid nozzle 20 is connected to the downstream end of the feed tube 41 through which the chemical liquid is fed to the substrate processing apparatus 1. The feed tube 41 is provided with a valve 42, and the upstream end of the feed tube 41 is connected to the chemical liquid tank 43.

The chemical liquid tank 43 can store the chemical liquid as a raw material of a film to be formed on the wafer W. More specifically, the chemical liquid is a liquid-form chemical in which a raw material is mixed with a predetermined solvent. The raw material is, for example, a resist material, and the film formed on the wafer W in this case is a resist film. A component such as the solvent in the chemical liquid is preferably the one unlikely to solubilize a solidified film described later.

The chemical liquid is ejected through the chemical liquid nozzle 20, with use of the chemical liquid tank 43, the valve 42, and the feed tube 41, whereby the chemical liquid is applied to the outer edge portion of the wafer W. With the wafer W kept rotated by the turntable 11, an excessive chemical liquid ejected to the outer edge portion of the wafer W is spun off from the wafer W by the centrifugal force.

The gas nozzle 30 as the solidified film forming unit is arranged above the outer edge portion of the wafer W that is supported on the turntable 11, and solidifies the chemical liquid applied to the outer edge portion of the wafer W, to form the solidified film that forms a part of the annular film. The gas nozzle 30 is arranged on the downstream side, in the direction of rotation RD of the wafer W, of the position where the chemical liquid nozzle 20 is arranged.

With such an arrangement of the chemical liquid nozzle 20 and the gas nozzle 30, the chemical liquid, after applied through the chemical liquid nozzle 20 to the outer edge portion of the rotating wafer W, can be solidified by the gas nozzle 30 arranged on the downstream side.

The gas nozzle 30 is connected to the downstream end of the feed tube 51 through which a predetermined gas is fed to the substrate processing apparatus 1. The feed tube 51 is provided with the valve 52, and with the gas reservoir 54 on the upstream side of the valve 52. The upstream end of the feed tube 51 is connected to the gas tank 53.

The gas tank 53 is a supply source of the predetermined gas. The predetermined gas usable here may typically be an inert gas such as nitrogen gas, rare gases, or a mixed gas of some of these gases. The gas reservoir 54 can temporarily store the predetermined gas. A heating unit 55 such as a heater is provided around the gas reservoir 54. The heating unit 55 heats the gas temporarily stored in the gas reservoir 54, up to a predetermined temperature.

With the involvement of the gas tank 53, the gas reservoir 54, the heating unit 55, and the valve 52, the heated gas is ejected through the gas nozzle 30 onto the outer edge portion of the wafer W. The heated gas, after ejected onto the outer edge portion of the wafer W, then vaporizes the solvent contained in the chemical liquid having been applied to the outer edge portion. This removes at least a part of the solvent in the chemical liquid, and allows the raw material in the chemical liquid to solidify to form the solidified film. Note that the heated gas may alternatively serve as a carrier gas for solvent molecule, to remove the solvent in the chemical liquid.

The cup 12 is arranged so as to surround the turntable 11. The upper end portion of the cup 12 is extended towards the outer edge portion of the wafer W, so as to shadow the outer edge portion of the wafer W that is supported on the turntable 11. With this structure, the chemical liquid spun off from the wafer W by the centrifugal force is caught by the cup 12, and is prevented from being scattered to the periphery. The chemical liquid caught by the cup 12 may be recovered and recycled.

The control unit 60 has a form of a computer equipped with a central processing unit (CPU), a read only memory (ROM), a random access memory (RAM), and so forth, and controls various units in the substrate processing apparatus 1.

That is, the control unit 60 causes an unillustrated rotary motor to rotate the turntable 11. The control unit 60 also causes the heating unit 55 to heat the gas in the gas reservoir 54, up to a predetermined temperature. The control unit 60 also controls opening and closing of the valves 42 and 52 to control feeding of the chemical liquid and the gas, respectively, to the wafer W.

The control unit 60 may alternatively have an unillustrated storage device. The storage device typically stores one or more recipes in which various conditions for processing the wafer W are prescribed.

Figure 2:
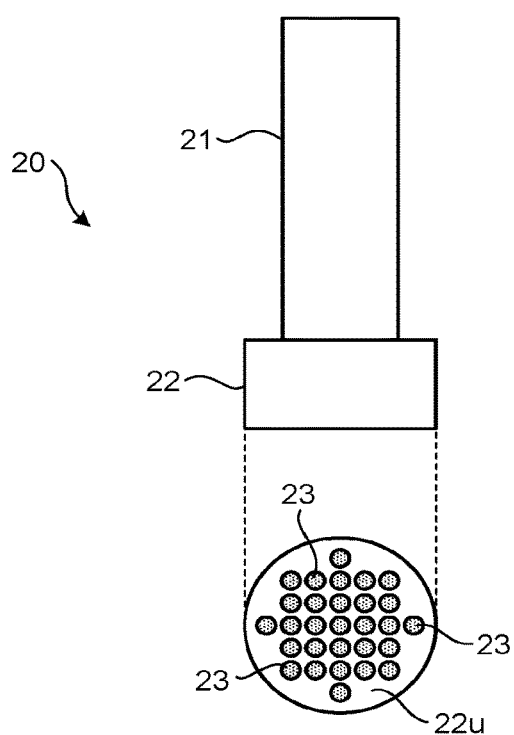
FIG. 2 is a drawing illustrating an exemplary structure of a chemical liquid nozzle equipped on the substrate processing apparatus according to the first embodiment.

FIG. 2 is a drawing illustrating an exemplary structure of a chemical liquid nozzle 20 equipped on the substrate processing apparatus 1 according to the first embodiment. As illustrated in FIG. 2, the chemical liquid nozzle 20 has a body 21 and an ejector 22.

The body 21 is designed to be connectable with the feed tube 41, and typically has a cylindrical shape. The cylindrical body 21 is hollow inside, through which the chemical liquid fed through the feed tube 41 can reach the ejector 22.

The ejector 22 typically has a cylindrical shape, and has a circular ejection face 22u. The ejection face 22u of the ejector 22 has a plurality of ejection orifices 23. The individual ejection orifices 23 are arranged to form a lattice pattern in a circular region of the ejection face 22u. The chemical liquid is ejected through each of the plurality of ejection orifices 23.

Figure 3:
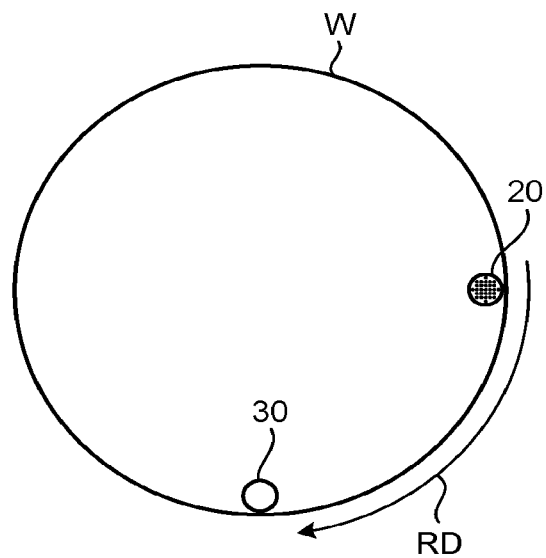
FIG. 3 is a plan view illustrating an arrangement of the chemical liquid nozzle and a gas nozzle equipped on the substrate processing apparatus according to the first embodiment.

FIG. 3 is a plan view illustrating an arrangement of the chemical liquid nozzle 20 and the gas nozzle 30 equipped on the substrate processing apparatus 1 according to the first embodiment. As illustrated in FIG. 3, the gas nozzle 30 is arranged on the downstream side in the direction of rotation RD of the wafer W, a predetermined distance away from the chemical liquid nozzle 20.

More specifically, the gas nozzle 30 is typically arranged within the range from 30° or larger to 330° or smaller away, in the circumferential direction of the wafer W, from a position where the chemical liquid nozzle 20 is arranged, which is more preferably within the range from 30° or larger to 180° or smaller. In an exemplary case illustrated in FIG. 3, the gas nozzle 30 is arranged 90° away, in the circumferential direction of the wafer W, from the position where the chemical liquid nozzle 20 is arranged.

Figure 4A:
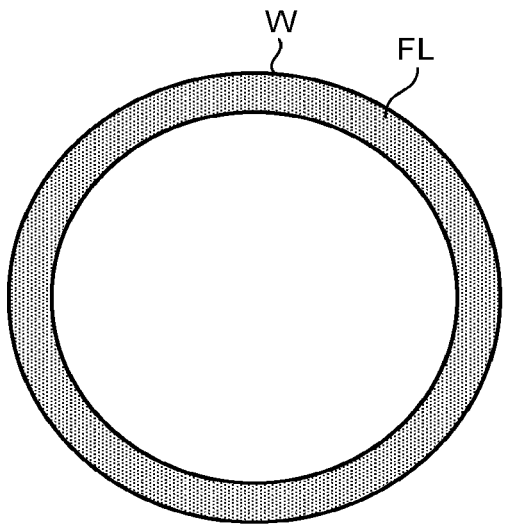
FIGS. 4A to 4C are drawings illustrating an exemplary film formed by using the substrate processing apparatus according to the first embodiment.
Figure 4B:
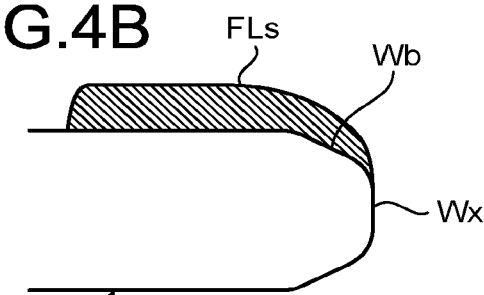
Figure 4C:
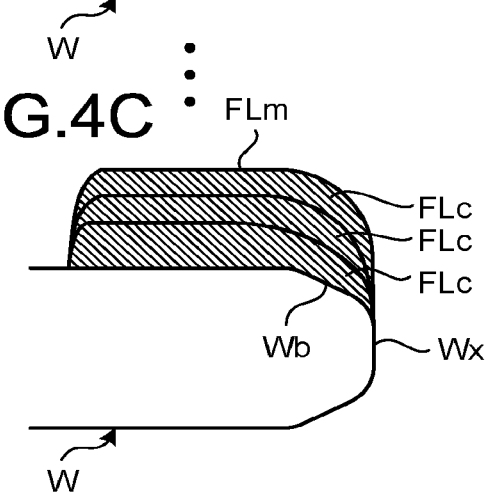

FIGS. 4A to 4C are drawings illustrating an exemplary film FL formed by using the substrate processing apparatus 1 according to the first embodiment. FIG. 4A is a plan view of a wafer W with a film FL formed on the outer edge portion. FIG. 4B is a cross-sectional view of the outer edge portion and around of the wafer W having a single-layer film FLs formed thereon. FIG. 4C is a cross-sectional view of the outer edge portion and around of the wafer W having a multilayered film FLm formed thereon.

As illustrated in FIG. 4A, the substrate processing apparatus 1 can form the annular film FL on the outer edge portion of the wafer W. The film FL is typically a resist film or the like, formed by applying the chemical liquid that contains a resist material as a raw material.

The wafer W as the substrate may typically be a semiconductor wafer mainly composed of silicon, gallium arsenide, or the like; a non-conductor wafer mainly composed of ceramic or the like; or a conductor wafer mainly composed of alumina, diamond, or the like. The wafer W may alternatively have various films to be processed (not illustrated), which are exemplified by insulating films such as silicon oxide film or silicon nitride film; and metal films such as Cu film and W film, formed on the top surface on which a semiconductor device will be arranged.

As illustrated in FIG. 4B, there is a single-layer film FLs as the film FL that can be formed by the substrate processing apparatus 1. The single-layer film FLs is formed by ejecting a chemical liquid through the chemical liquid nozzle 20 onto the wafer W which is kept rotated in the substrate processing apparatus 1.

The outer edge portion of the wafer W includes at least a bevel Wb. The bevel Wb is a curved region that connects an upper face and an end face Wx of the wafer W. The end face Wx of the wafer W is a surface substantially orthogonal to the upper face of the wafer W. The single-layer film FLs covers at least the bevel Wb which resides in the outer edge portion of the wafer W, and also covers a part of the upper face of the wafer W. The upper face of the wafer W covered with the single-layer film FLs corresponds to a region which resides outside of a region where the semiconductor device is arranged.

The single-layer film FLs has a predetermined thickness corresponded to viscosity of the ejected chemical liquid, and rotational speed of the wafer W. The thickness of the single-layer film FLs tends to increase typically as the viscosity of the ejected chemical liquid increases, and tends to decrease as the rotational speed of the wafer W increases.

As illustrated in FIG. 4C, there is a multilayered film FLm as another film FL that can be formed by the substrate processing apparatus 1. The multilayered film FLm is formed by stacking a plurality of solidified films FLc which are formed by solidifying the chemical liquid with use of the gas nozzle 30.

The multilayered film FLm covers at least the bevel Wb which resides in the outer edge portion of the wafer W, and also covers a part of the upper face of the wafer W. The upper face of the wafer W covered with the multilayered film FLm corresponds to a region which resides outside of a region where the semiconductor device is arranged.

Each of the solidified films FLc has a predetermined film thickness corresponded to viscosity of the ejected chemical liquid, rotational speed of the wafer W, and temperature of the ejected gas.

The thickness of the solidified film FLc tends to increase typically as the viscosity of the chemical liquid to be ejected increases, and tends to decrease as the rotational speed of the wafer W increases. Tendency of increase or decrease of the film thickness affected by the gas temperature depends on cases. The higher the gas temperature, the more the solidified film FLc would shrink thereby decreasing the thickness, meanwhile rapid solidification of the chemical liquid before being spun off from the wafer W would increase the total amount of the chemical liquid fixed on the wafer W, thereby possibly increasing the thickness of the solidified film FLc.

The multilayered film FLm has a predetermined thickness, corresponding to the number of stacked layers of the solidified film FLc. That is, the more the solidified films FLc are stacked, the thicker the formed multilayered film FLm will be.

Note that the exemplary case illustrated in FIG. 4C does not mean that the solidified films FLc in the multilayered film FLm are discriminable from each other. Each of the solidified films FLc does not always necessarily have an observable boundary with the adjoining solidified film FLc.

FIG. 5 is a drawing illustrating an exemplary recipe table 61 stored in the substrate processing apparatus 1 according to the first embodiment. As described previously, the control unit 60 stores one or more recipes. The recipe is typically stored in the form of a recipe table 61, in the control unit 60.

As illustrated in FIG. 5, the recipe table 61 typically includes a plurality of recipes. The recipe that represents process conditions contains not only recipe names by which the individual recipes are discriminated, but also contains a plurality of parameters regarding the turntable 11, the chemical liquid nozzle 20, the gas nozzle 30, and so forth.

The recipe name is an item having preset therein names for discriminating the individual recipes. Alternatively, an item such as recipe ID or the like may be contained in the recipe table 61, in place of, or in addition to the recipe name, so long as the individual recipes are discriminable.

The parameters regarding the turntable 11 include rotation start timing ("START" in the drawing), rotation end timing ("END" in the drawing), and rotations per minute.

The rotation start timing represents time to start rotation of the turntable 11, and may be typically set to a point in time at or after which the wafer W is placed on the turntable 11. The rotation end timing represents time to end rotation of the turntable 11, and may be typically set to a point in time at or after which the film FL is formed on the wafer W. The rotations per minute (rpm) represent the rotational speed of the turntable 11.

The parameters regarding the chemical liquid nozzle 20 include ejection start timing ("START" in the drawing) and ejection end timing ("END" in the drawing).

The ejection start timing represents time to start ejection of the chemical liquid through the chemical liquid nozzle 20, and may be typically set to a point in time at or after which the turntable 11 starts to rotate, and the rotations per minute stabilizes. The ejection end timing represents time to end ejection of the chemical liquid through the chemical liquid nozzle 20, and is freely set depending on a desired thickness of the film FL to be formed.

Other parameters such as volume of ejection of the chemical liquid may be set as the parameters regarding the chemical liquid nozzle 20.

The parameters regarding the gas nozzle 30 typically include ejection start timing ("START" in the drawing), ejection end timing ("END" in the drawing), and heating temperature ("TEMPERATURE" in the drawing).

The ejection start timing represents time to start ejection of the gas through the gas nozzle 30, and may be typically set to a point in time before or after ejection of the chemical liquid is started. The ejection start timing may be preferably set to a point in time substantially same as the time when ejection of the chemical liquid is started. The ejection end timing represents time to end ejection of the gas through the gas nozzle 30, and may be typically set to a point in time substantially same as the time when ejection of the chemical liquid ends. The ejection end timing is preferably set to a point in time after ejection of the chemical liquid, and at or after which the ejected chemical liquid is totally solidified.

As described above, the ejection of the chemical liquid through the chemical liquid nozzle 20 takes place concurrently with the ejection of the gas through the gas nozzle 30. That is, there is a period over which the ejection period of the chemical liquid through the chemical liquid nozzle 20 overlaps the ejection period of the gas through the gas nozzle 30. The ejection period of the chemical liquid through the chemical liquid nozzle 20 in this case may substantially coincide with the ejection period of the gas through the gas nozzle 30.

In a preferred case, the ejection period of the gas through the gas nozzle 30 is longer than the ejection period of the chemical liquid through the chemical liquid nozzle 20, and the ejection period of the chemical liquid through the chemical liquid nozzle 20 falls in the ejection period of the gas through the gas nozzle 30. This makes the chemical liquid quickly start solidification upon being applied, and can improve efficiency of stacking of the multilayered film FLm. This also suppresses the chemical liquid from remaining unsolidified.

The heating temperature is a preset temperature of the heating unit 55, and is set so that the gas ejected through the gas nozzle 30 will have temperature higher than, for example, the boiling point of the solvent contained in the chemical liquid. This can remove the solvent from the chemical liquid against which the gas is ejected, and can form the solidified film FLc as a result of solidification of the raw material. More specifically, the heating temperature is set so that the temperature of the gas ejected through the gas nozzle 30 will be, for example, 100° C. or higher to 200° C. or lower, preferably 100° C. or higher to 160° C. or lower, and more preferably 100° C. or higher to 150° C. or lower.

Other parameters such as ejection amount of gas may alternatively be set as the parameter regarding the gas nozzle 30. In a case where a plurality of species of gas are feedable in the substrate processing apparatus 1, gas species may alternatively be set as the parameter regarding the gas nozzle 30.

Alternatively in a case where the single-layer film FLs is formed as described above, the gas nozzle 30 will be disused. Hence as indicated by diagonal lines in the drawing, the recipe table 61 may contain a recipe having no preset parameters regarding the gas nozzle 30. Note, however, that even in a case where the single-layer film FLs is formed, the gas may be ejected through the gas nozzle 30 to solidify the chemical liquid in the substrate processing apparatus 1, upon completion of ejection of the chemical liquid through the chemical liquid nozzle 20.

Method for Manufacturing Semiconductor Device

Next, a method for manufacturing a semiconductor device according to the first embodiment will be explained referring to FIGS. 6Aa to 8C. The method for manufacturing a semiconductor device according to the first embodiment includes a process for forming the film FL in the substrate processing apparatus 1.

Figure 6A:
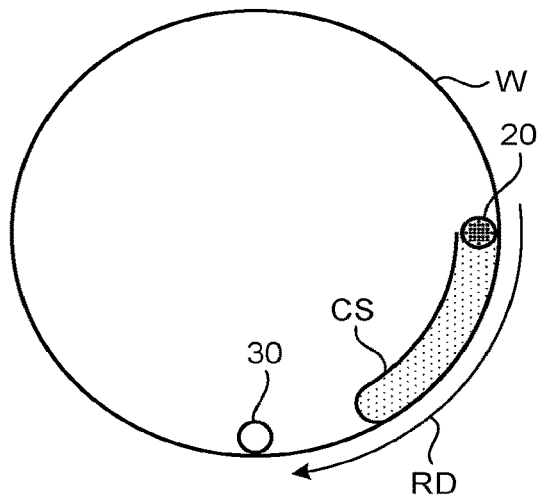
FIGS. 6Aa to 6Cb are drawings illustrating a course of forming a single-layer film on a wafer by using the substrate processing apparatus according to the first embodiment.
Figure 6A:
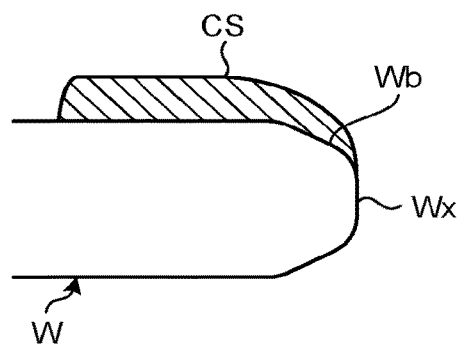

FIGS. 6Aa to 6Cb are drawings illustrating a course of forming the single-layer film FLs on the wafer W by using the substrate processing apparatus 1 according to the first embodiment. Note now that FIGS. 6Aa, 6Ba, and 6Ca are plan views of the wafer W, and FIGS. 6Ab, 6Bb, and 6Cb are cross-sectional views of the outer edge portion and around of the wafer W.

As illustrated in FIGS. 6Aa and 6Ab, application of the chemical liquid through the chemical liquid nozzle 20 starts towards the outer edge portion of the wafer W which is kept rotated. The chemical liquid is applied to a region having a predetermined width including the bevel Wb of the wafer W, similarly to the aforementioned region covered by the single-layer film FLs, thereby forming a coated film CS in a liquid state. The coated film CS is successively formed on the outer edge portion of the wafer W that travels below the chemical liquid nozzle 20, as the wafer W rotates. At this time, an excessive portion of the chemical liquid applied to the outer edge portion is spun off from the wafer W, by the centrifugal force that accompanies the rotation of the wafer W.

Note that the gas nozzle 30 is arranged, as described previously, a predetermined distance away from the chemical liquid nozzle 20. With the gas nozzle 30 arranged a suitable distance away from the position where the chemical liquid nozzle 20 is arranged, the gas nozzle 30 is suppressed from being contaminated typically due to scattered chemical liquid from the chemical liquid nozzle 20.

Figure 6B:
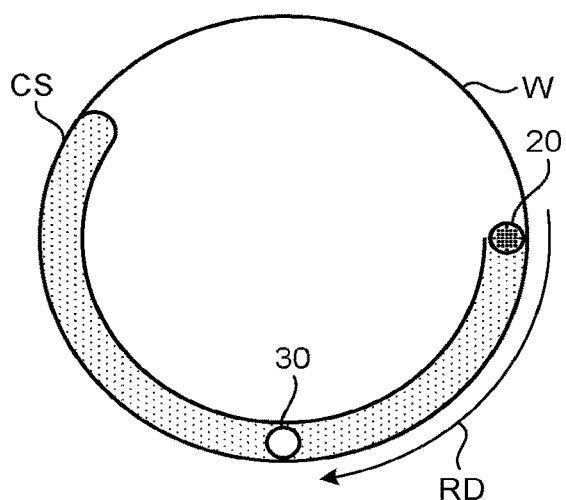
Figure 6B:
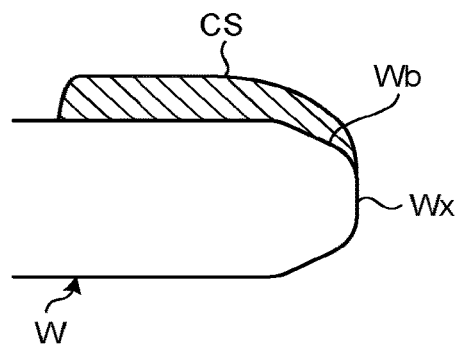

As illustrated in FIGS. 6Ba and 6Bb, the outer edge portion of the wafer W, having the coated film CS formed thereon, travels below the gas nozzle 30 as the wafer W rotates. When forming the single-layer film FLs, the gas is not ejected through the gas nozzle 30, while the chemical liquid is applied through the chemical liquid nozzle 20. Hence the coated film CS that has traveled below the gas nozzle 30 remains in a liquid form.

Figure 6C:
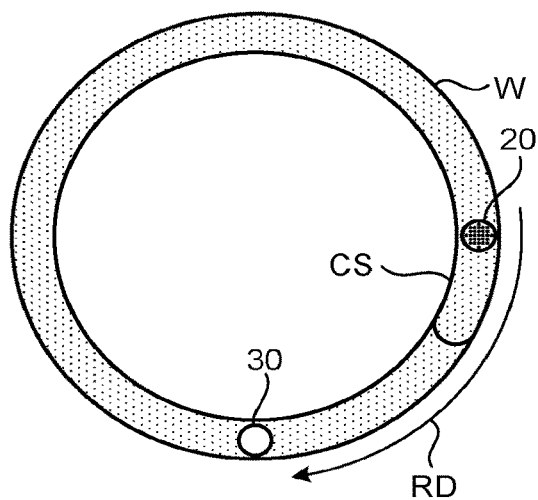
Figure 6C:
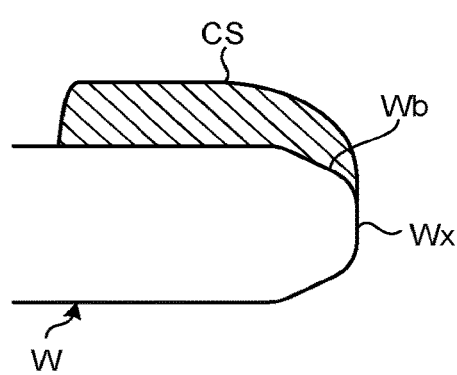

Upon completion of a single turn of the wafer W after the start of application of the chemical liquid, the outer edge portion of the wafer W having the coated film CS already formed thereon then travels below the chemical liquid nozzle 20, as illustrated in FIGS. 6Ca and 6Cb. In this state, the chemical liquid is further applied through the chemical liquid nozzle 20 towards the coated film CS on the outer edge portion of the wafer W. Note, however, that the thickness of the coated film CS increases only slightly or remains almost unchanged, since the excessive portion of the chemical liquid is spun off from the wafer W by the centrifugal force accompanying the rotation of the wafer W.

Thereafter, the chemical liquid is overlaid on the wafer W up to the ejection end timing of the chemical liquid. After completion of ejection of the chemical liquid, ejection of the gas through the gas nozzle 30 may be started to solidify the coated film CS on the outer edge portion of the wafer W. Alternatively, in place of, or in addition to solidification of the chemical liquid by ejection of the gas, the wafer W unloaded from the substrate processing apparatus 1 may be subjected to post-baking to further solidify the coated film CS.

In this way, the annular single-layer film FLs is formed on the outer edge portion of the wafer W.

Figure 7A:
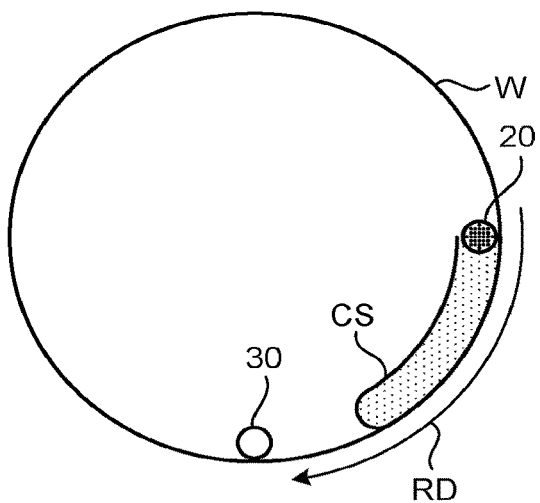
FIGS. 7Aa to 7Cb are drawings illustrating a course of forming a multilayered film on a wafer by using the substrate processing apparatus according to the first embodiment.
Figure 7A:
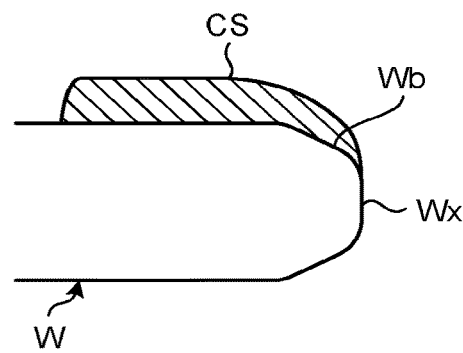

FIGS. 7Aa to 7Cb are drawings illustrating a course of forming the multilayered film FLm on the wafer W, by using the substrate processing apparatus 1 according to the first embodiment. Note now that FIGS. 7Aa, 7Ba, and 7Ca are plan views of the wafer W, and FIGS. 7Ab, 7Bb, and 7Cb are cross-sectional views of the outer edge portion and around of the wafer W.

Processes illustrated in FIGS. 7Aa and 7Ab are same as those illustrated in FIGS. 6Aa and 6Ab described previously. The coated film CS in a liquid form is formed in a region having a predetermined width including the bevel Wb on the wafer W, similarly to the region covered by the aforementioned multilayered film FLm.

Figure 7B:
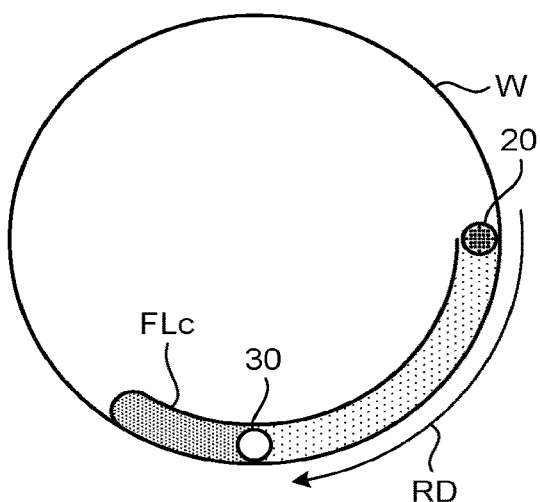
Figure 7B:
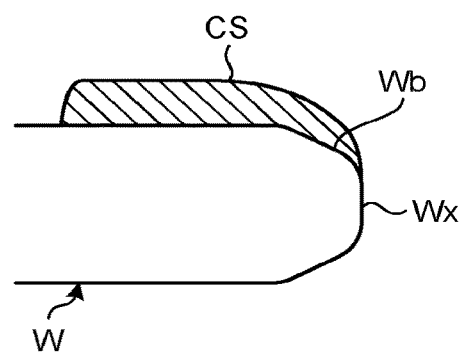

As illustrated in FIGS. 7Ba and 7Bb, the outer edge portion of the wafer W, having the coated film CS formed thereon, travels below the gas nozzle 30 as the wafer W rotates. At this time, a heated gas is ejected through the gas nozzle 30 towards the coated film CS on the outer edge portion of the wafer W.

In this way, the coated film CS on the outer edge portion of the wafer W is solidified to form the solidified film FLc. The solidified film FLc is successively formed on the outer edge portion of the wafer W that travels below the gas nozzle 30, as the wafer W rotates.

Figure 7C:
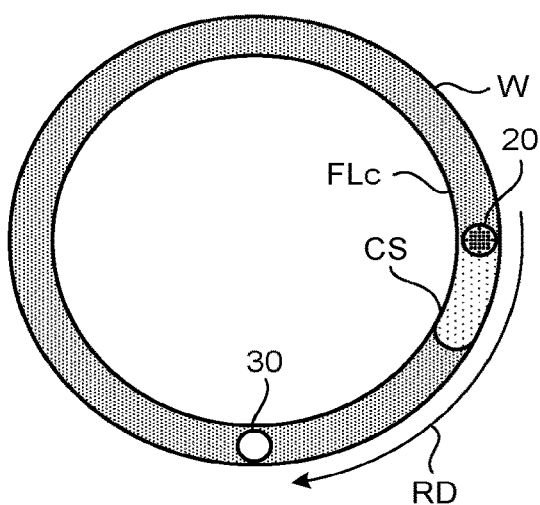
Figure 7C:
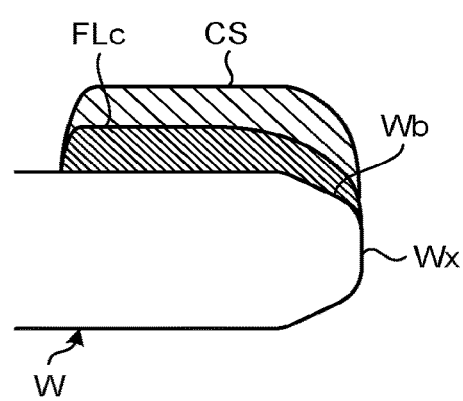

Upon completion of a single turn of the wafer W after the start of application of the chemical liquid, the outer edge portion of the wafer W having the solidified film FLc already formed thereon travels below the chemical liquid nozzle 20, as illustrated in FIGS. 7Ca and 7Cb. In this state, the chemical liquid is further applied through the chemical liquid nozzle 20 towards the solidified film FLc on the outer edge portion of the wafer W. While the excessive chemical liquid is spun off from the wafer W by the centrifugal force, total thickness of the solidified film FLc and the coated film CS resulted from application of the chemical liquid increases by the thickness of the solidified film FLc.

By using, at this time, the chemical liquid free of component possibly solubilizing the solidified film FLc as described previously, the solidified film FLc is suppressed from decreasing the thickness, thereby enabling efficient increment of the thickness.

The gas nozzle 30 is, as described previously, arranged a predetermined distance away from the chemical liquid nozzle 20. With the gas nozzle 30 arranged a proper distance away from the position where the chemical liquid nozzle 20 is arranged, it now becomes possible to suppress the gas nozzle 30 from being contaminated by the scattered chemical liquid, to elongate the time from heating of the coated film CS up to the next application of the chemical liquid onto the already formed solidified film FLc, and to continue removal of the solvent from the solidified film FLc after heating, thereby efficiently stacking the solidified film FLc.

Thereafter, the solidified film FLc is stacked on the wafer W until the ejection end timing of the chemical liquid is reached. Ejection of the gas through the gas nozzle 30 may alternatively be continued even after completion of ejection of the chemical liquid, so as to more reliably remove the solvent from the solidified film FLc. The wafer W ejected from the substrate processing apparatus 1 may alternatively be subjected to post-baking to further promote the solidification of the solidified film FLc.

In this way, the annular multilayered film FLm is formed on the outer edge portion of the wafer W.

Figure 8A:
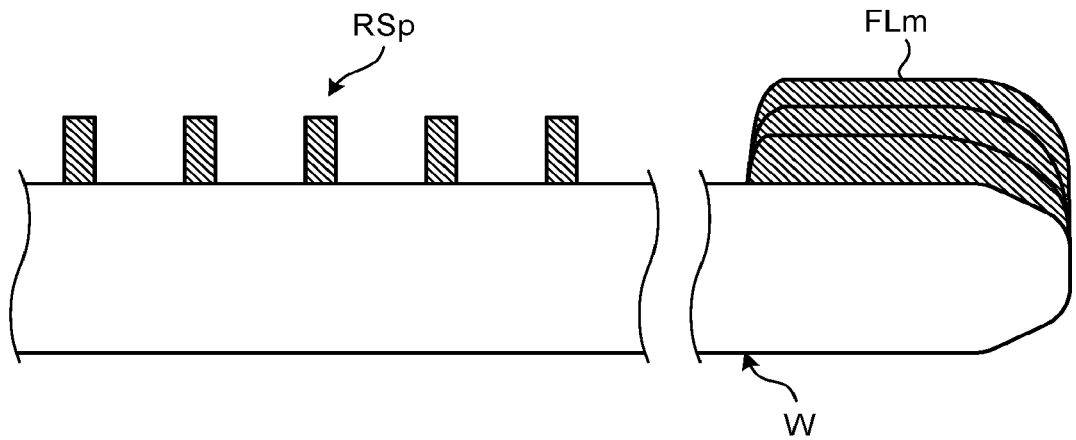
FIGS. 8A to 8C are cross-sectional views illustrating other steps included in the method for manufacturing a semiconductor device according to the first embodiment.
Figure 8B:
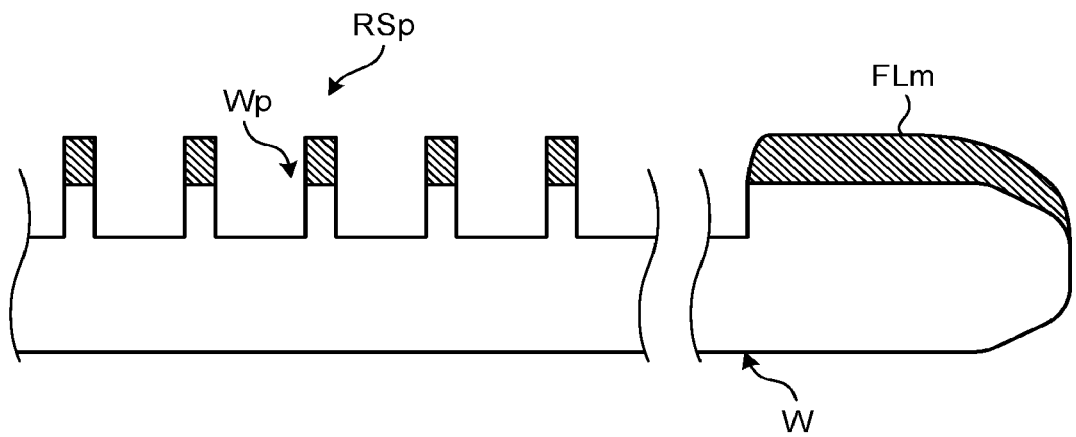
Figure 8C:
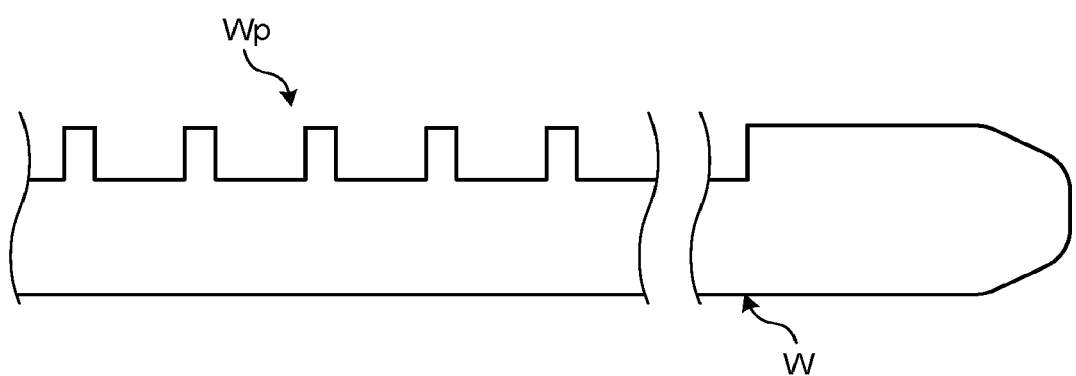

FIGS. 8A to 8C are cross-sectional views illustrating other steps included in the method for manufacturing a semiconductor device according to the first embodiment. Note that the exemplary case illustrated in FIGS. 8A to 8C relates to an exemplary processing made on the wafer W having the multilayered film FLm formed thereon. Note, however, that also the processing on the wafer W having the single-layer film FLs formed thereon is conducted in the same way as the process explained below.

As illustrated in FIG. 8A, in the central part of the wafer W in which a semiconductor device according to the first embodiment will be arranged, there is a resist pattern RSp formed as a mask pattern. On the outer edge portion of the wafer W, there is the multilayered film FLm formed as described above. The resist pattern RSp and the multilayered film FLm may be formed in any order.

As illustrated in FIG. 8B, the central part of the wafer W is etched through the resist pattern RSp used as a mask, while protecting the outer edge portion of the wafer W with the multilayered film FLm. In this way, a wafer pattern Wp having the resist pattern RSp transferred therein is formed in the central part of the wafer W. In this process, the wafer pattern Wp is not formed in the outer edge portion of the wafer W which is protected by the multilayered film FLm.

Note that the wafer W may have a film to be processed as described above, and such a film to be processed in the central part of the wafer W may have a pattern transferred from the resist pattern RSp.

The resist pattern RSp and the multilayered film FLm are then removed as illustrated in FIG. 8C, typically with use of oxygen plasma.

The semiconductor device of the first embodiment may be manufactured by properly repeating the steps of forming the pattern on the wafer W, forming the film to be processed, and forming the pattern in the film to be processed, as described above.

Exemplary Processing with Use of Substrate Processing Apparatus

Next, an exemplary substrate processing according to the first embodiment will be explained referring to FIG. 9. FIG. 9 is a flowchart illustrating an exemplary procedure of substrate processing according to the first embodiment.

As illustrated in FIG. 9, the control unit 60 of the substrate processing apparatus 1 loads a desired recipe in the recipe table 61 (Step S101). The desired recipe is typically a recipe of the user's choice from the recipe table 61.

The control unit 60 acts to load the wafer W on the substrate processing apparatus 1, typically with use of an unillustrated conveyance mechanism (Step S102). The loaded wafer W is placed on the turntable 11.

The control unit 60 acts to start rotation of the wafer W by using the turntable 11 according to the loaded recipe, at predetermined rotations per minute, and at predetermined timing (Step S103). The wafer W is kept rotated thereafter, until formation of the film FL on the wafer W comes to the end.

The control unit 60 refers to the loaded recipe, and determines whether the film FL which is about to be formed is the multilayered film FLm or not (Step S104). That is, if the parameters regarding the gas nozzle 30 are preset on the loaded recipe, then the film to be formed is the multilayered film FLm, whereas if the parameters related to the gas nozzle 30 are not preset, then the film to be formed is the single-layer film FLs.

If the film to be formed is the multilayered film FLm (Step S104: Yes), the control unit 60 acts to stack a plurality of solidified films FLc, whereby the multilayered film FLm is formed (Steps S111 to S113).

More specifically, the control unit 60 acts to keep the wafer W rotated, and to apply the chemical liquid to the outer edge portion of the wafer W. Concurrently with such application of the chemical liquid, the control unit 60 also acts to solidify the chemical liquid applied to the outer edge portion of the wafer W, at a position on the downstream side in the direction of rotation RD of the wafer W, away from the position where the chemical liquid is applied, thereby forming the solidified film FLc.

That is, the control unit 60 acts to start applying the chemical liquid through the chemical liquid nozzle 20, and to start ejecting the heated gas through the gas nozzle 30 (Step S111).

The control unit 60 also acts to maintain application of the chemical liquid and ejection of the heating gas, until a predetermined number of solidified films FLc are formed (Step S112: No). That is, the control unit 60 refers to the loaded recipe, and acts to maintain application of the chemical liquid and ejection of the heating gas, until the individual end timings are reached.

Upon formation of the predetermined number of solidified films FLc (Step S112: Yes), the control unit 60 acts to stop application of the chemical liquid through the chemical liquid nozzle 20, and to stop ejection of the heated gas through the gas nozzle 30 (Step S113).

If the film to be formed is the single-layer film FLs (Step S104: No), the control unit 60 acts to apply the chemical liquid to the outer edge portion of the wafer W which is kept rotated, thereby forming the single-layer film FLs (Steps 5121 to S124).

That is, the control unit 60 acts to start applying the chemical liquid through the chemical liquid nozzle 20 (Step S121).

The control unit 60 also acts to maintain application of the chemical liquid until the chemical liquid reaches a predetermined thickness (Step S122: No). That is, the control unit 60 refers to the loaded recipe, and acts to maintain application of the chemical liquid, until the end timing is reached.

Upon arrival at the predetermined thickness of the chemical liquid (Step S122: Yes), the control unit 60 acts to terminate application of the chemical liquid through the chemical liquid nozzle 20 (Step S123).

After completion of application of the chemical liquid, the control unit 60 acts to eject the heated gas through the gas nozzle 30, and to solidify the chemical liquid applied to the outer edge portion of the wafer W, thereby forming the single-layer film FLs (Step S124). Note that the chemical liquid may be solidified to form the single-layer film FLs, alternatively by subjecting the wafer W to post-baking outside the substrate processing apparatus 1. In this case, the processing of Step S124 is not always necessary.

Upon completion of formation of the film FL on the wafer W, the control unit 60 acts to terminate rotation of the wafer W with use of the turntable 11 (Step S131). The control unit 60 acts to unload the wafer W out of the substrate processing apparatus 1, with use of an unillustrated conveyance mechanism or the like (Step S132).

In this way, processing of the substrate with use of the substrate processing apparatus 1 of the first embodiment comes to the end.

Note that the wafer W may thereafter be subjected to post-baking, thereby more thoroughly removing the solvent from the single-layer film FLs or the multilayered film FLm.

SUMMARY

Processing for forming an annular film on the outer edge portion of a wafer occasionally takes place, in a process for manufacturing a semiconductor device. The annular film is used as a protective film for protecting the outer edge portion, typically in a case where a fine pattern or the like is formed in the central part of the wafer, and suppresses formation of the fine pattern also in the outer edge portion. This is because the fine pattern, if formed in the outer edge portion, would be broken and would produce particles typically when the wafer is handled, which is undesirable.

The annular film, when formed, is required to have a proper thickness, depending on etching conditions that include etching selectivity of the protective film. This is because the film with too small thickness would not function as the protective film, whereas the film with too large thickness would take a long time for removal thereof.

Processing while properly varying the thickness of the film, with use of the substrate processing apparatus that forms an annular film, however needs change of the chemical liquid suited to every desired film thickness, loading of a plurality of types of chemical liquid having different viscosities suited to every desired film thickness on the substrate processing apparatus, or repetition of application of the chemical liquid in the substrate processing apparatus and baking outside the apparatus, until a desired film thickness is reached. Change of the chemical liquid undesirably elongates down time of the substrate processing apparatus, and loading of the plurality of types of chemical liquid undesirably increases size and cost of the substrate processing apparatus. Application of the chemical liquid and baking, if repeated between the different apparatuses, undesirably degrades efficiency of manufacture of the semiconductor device.

The substrate processing apparatus 1 of the first embodiment has the gas nozzle 30 that is arranged on the downstream side in the direction of rotation RD of the wafer, away from the position where the chemical liquid nozzle 20 is arranged, and ejects the heated gas onto the outer edge portion of the wafer W. This enables efficient formation of the film FL having various levels of thickness. That is, a plurality of solidified films FLc may be stacked to form the multilayered film FLm having a freely selectable thickness. This successfully suppresses the substrate processing apparatus 1 from causing elongated down time, enlargement of size, and increase of cost, and also successfully improves efficiency of manufacture of the semiconductor device.

According to the substrate processing apparatus 1 of the first embodiment, the gas nozzle 30 is arranged within the range of 30° or larger to 330° or smaller away, in the circumferential direction of the wafer W, from the position where the chemical liquid nozzle 20 is arranged. Hence, contamination of the gas nozzle 30 due to scattering of the chemical liquid through the chemical liquid nozzle 20 can be suppressed, and the solidified film FLc can be efficiently formed.

In the substrate processing apparatus 1 of the first embodiment, the chemical liquid nozzle 20 has a plurality of ejection orifices 23 through which the chemical liquid is ejected. This planarizes the annular film FL formed on the wafer W. The point will be detailed referring to FIGS. 10Aa to 10Bb.

Figure 10A:
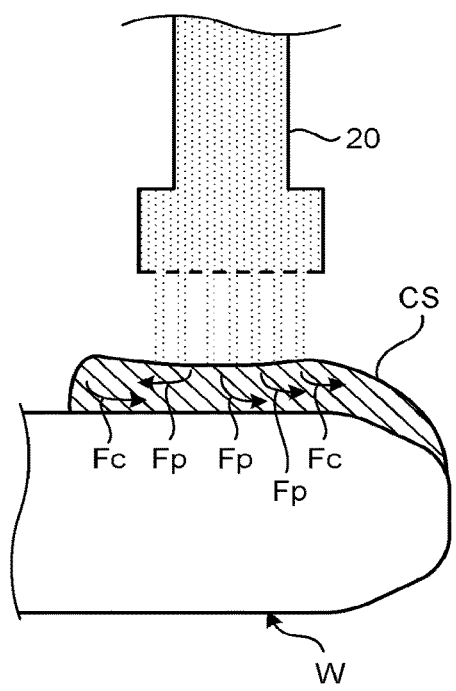
FIGS. 10Aa to 10Bb are cross-sectional views illustrating courses of forming the films by using chemical liquid nozzles of the first embodiment and Comparative Example.
Figure 10A:
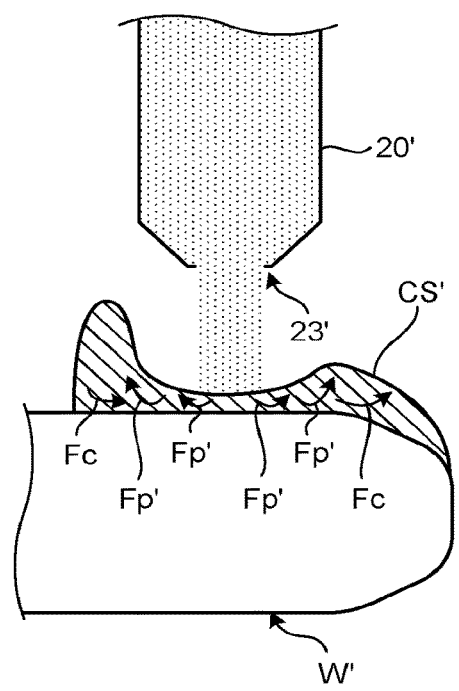

FIGS. 10Aa to 10Bb are cross-sectional views illustrating a course of forming the films, by using the chemical liquid nozzles of the first embodiment and Comparative Example. FIGS. 10Aa and 10Ba illustrate a case where the chemical liquid nozzle 20 of the first embodiment is used, and FIGS. 10Ab and 10Bb illustrate a case where the chemical liquid nozzle 20' of Comparative Example is used.

As illustrated in FIG. 10Ab, the chemical liquid nozzle 20' of Comparative Example ejects the chemical liquid through a single ejection hole 23' having a large diameter. On the wafer W' of Comparative Example with a coated film CS' already formed thereon, the coated film CS' will have applied thereto, by the chemical liquid, a large ejection pressure Fp' that radially propagates. Hence the coated film CS' sinks largely at around the center in the width direction, whereas largely piles up at around the edge.

In the meantime, the coated film CS' is kept under the centrifugal force Fc that acts outwards on the wafer W', due to rotation of the wafer W'. Hence, the ejection pressure Fp' and the centrifugal force Fc, opposed to each other, can act on the coated film CS' at around the end thereof closer in the width direction to the center of the wafer W'. Hence the coated film CS' will pile up at around the end thereof closer to the center of the wafer W', more largely than at around the other end.

Figure 10B:
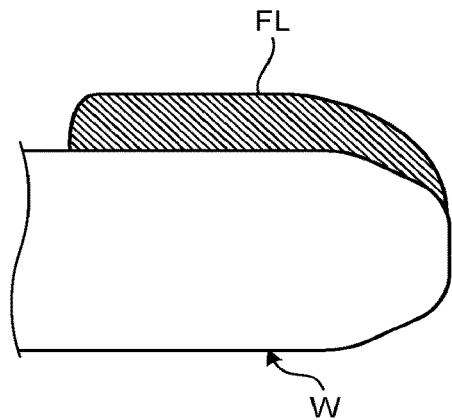
Figure 10B:
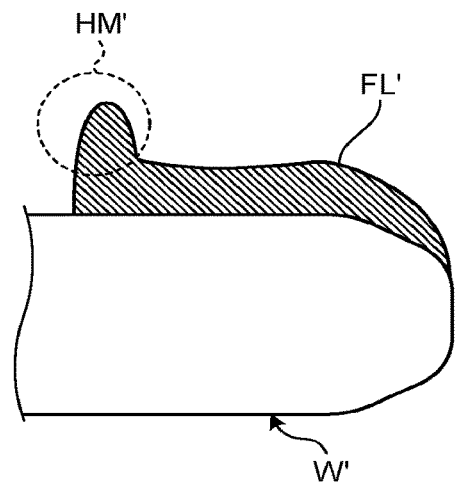

The film FL' of Comparative Example will have larger difference in thickness as illustrated in FIG. 10Bb, due to large ejection pressure Fp' of the chemical liquid. Moreover, the film FL' of Comparative Example would occasionally have a protrusion HM', formed at around the end closer to the center of the wafer W'.

Through the chemical liquid nozzle 20 of the first embodiment, the chemical liquid is ejected in thin streams, as illustrated in FIG. 10Aa. On the wafer W with the coated film CS already formed thereon, the coated film CS will have applied thereto, by the chemical liquid, an ejection pressure Fp that radially propagates. Hence the coated film CS slightly sinks at around the center in the width direction, whereas slightly piles up at around the ends. The ejection pressure Fp is, however, relatively small since the chemical liquid is ejected in thin streams, thereby resulting in relatively small difference of thickness in the width direction of the coated film CS.

In the meantime, the coated film CS is kept under the centrifugal force Fc that acts outwards on the wafer W, due to rotation of the wafer W. Hence, the ejection pressure Fp and the centrifugal force Fc, opposed to each other, can act on the coated film CS at around the end thereof closer in the width direction to the center of the wafer W. Since, however, the ejection pressure Fp of the chemical liquid is small as described above, the ejection pressure Fp and the centrifugal force Fc, opposed to each other, are less influential to the coated film CS.

Since, as illustrated in FIG. 10Ba, the ejection pressure Fp of the chemical liquid is suppressed to a low level, the film FL in the first embodiment has a difference of thickness smaller than that of the film FL' in Comparative Example, enabling formation of the film FL with a relatively high flatness.

According to the method for manufacturing the semiconductor device of the first embodiment, the chemical liquid applied to the outer edge portion of the wafer W is solidified, concurrently with application of the chemical liquid, thereby forming the solidified film FLc. Since the solidified film FLc is formed concurrently with application of the chemical liquid as described above, a plurality of solidified films FLc may be stacked to form the multilayered film FLm having a freely selectable thickness. That is, the films FL with varied thickness may be formed efficiently. This successfully suppresses the substrate processing apparatus 1 from causing elongated down time, enlargement of size, and increase of cost, and also successfully improves efficiency of manufacture of the semiconductor device.

In the method for manufacturing the semiconductor device of the first embodiment, the central part of the wafer W is etched while protecting the outer edge portion of the wafer W with the annular film FL. Hence, the outer edge portion of the wafer W is prevented from having any pattern formed therein, thereby suppressing generation of particles.

Modified Example 1

Next, a chemical liquid nozzle 20a according to Modified Example 1 of the first embodiment will be explained referring to FIG. 11. The chemical liquid nozzle 20a of Modified Example 1 has ejection orifices 23a arranged differently from the aforementioned chemical liquid nozzle 20 of the first embodiment.

Figure 11:
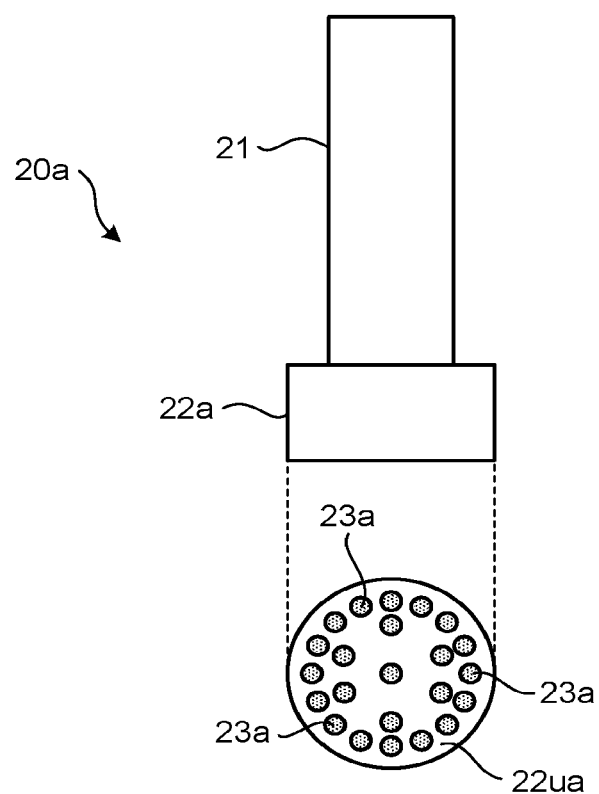
FIG. 11 is a drawing illustrating an exemplary structure of a chemical liquid nozzle equipped on a substrate processing apparatus according to Modified Example 1 of the first embodiment.

FIG. 11 is a drawing illustrating an exemplary structure of a chemical liquid nozzle 20a equipped on the substrate processing apparatus according to Modified Example 1 of the first embodiment. Note that, all structures in FIG. 11 same as those in FIG. 2 that illustrates the first embodiment will have same reference numerals, to skip the explanation.

The chemical liquid nozzle 20a has an ejector 22a, as illustrated in FIG. 11. The ejector 22a typically has a cylindrical shape, and has a circular ejection face 22ua. The ejection face 22ua of the ejector 22a has a plurality of ejection orifices 23a. The individual ejection orifices 23a are arranged concentrically in a circular region of the ejection face 22ua. The chemical liquid is ejected through each of the plurality of ejection orifices 23a.

In the substrate processing apparatus of Modified Example 1, the individual ejection orifices 23a of the chemical liquid nozzle 20a are concentrically arranged in the circular region. Also with such a configuration, the chemical liquid ejected through the chemical liquid nozzle 20a may be thinned, thereby weakening the ejection pressure. A flat annular film can therefore be formed.

Modified Examples 2 and 3

Next, structures of Modified Examples 2 and 3 of the first embodiment will be explained referring to FIGS. 12 and 13. Modified Examples 2 and 3 are different from the first embodiment, in the method for forming the solidified film.

Figure 12:
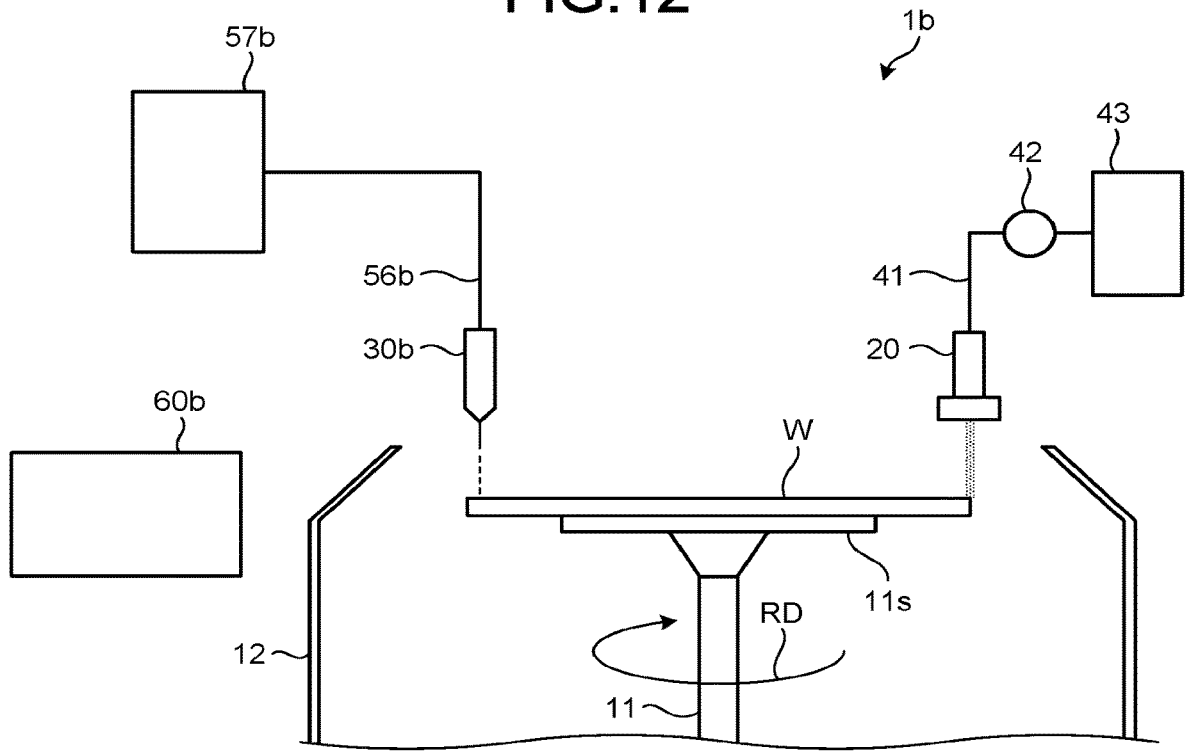
FIG. 12 is a drawing illustrating an exemplary structure of a substrate processing apparatus according to Modified Example 2 of the first embodiment.

FIG. 12 is a drawing illustrating an exemplary structure of a substrate processing apparatus 1b according to Modified Example 2 of the first embodiment. Note that, all structures in FIG. 12 same as those in FIG. 1 that illustrates the first embodiment will have same reference numerals, to skip the explanation.

The substrate processing apparatus 1b of Modified Example 2 has, as illustrated in FIG. 12, an irradiation nozzle 30b, a cable 56b, a laser oscillator 57b, and a control unit 60b, in place of the gas nozzle 30, the feed tube 51, the valve 52, the gas tank 53, the gas reservoir 54, the heating unit 55, and the control unit 60 of the aforementioned the first embodiment.

The irradiation nozzle 30b as a solidified film forming unit is arranged above the outer edge portion of the wafer W that is supported on the turntable 11, and solidifies the chemical liquid applied to the outer edge portion of the wafer W, to form the solidified film that forms a part of the annular film. The irradiation nozzle 30b is arranged on the downstream side in the direction of rotation RD of the wafer W, away from the position where the chemical liquid nozzle 20 is arranged.

More specifically, the irradiation nozzle 30b is typically arranged within the range from 30° or larger to 330° or smaller away, and preferably within the range from 30° or larger to 180° or smaller away, in the circumferential direction of the wafer W, from the position where the chemical liquid nozzle 20 is arranged.

The irradiation nozzle 30b is connected through the cable 56b to the laser oscillator 57b. Laser oscillator 57b generates a laser of a predetermined wavelength. The laser oscillator 57b may generate a pulse laser of a predetermined wavelength at predetermined intervals.

The laser is emitted through the irradiation nozzle 30b on the outer edge portion of the wafer W, with use of the irradiation nozzle 30b, the cable 56b, and the laser oscillator 57b. The laser emitted on the outer edge portion of the wafer W elevates the temperature of the chemical liquid applied to the outer edge portion, to vaporize the solvent contained in the chemical liquid. This removes at least a part of the solvent in the chemical liquid, and allows the raw material in the chemical liquid to solidify to form the solidified film.

The control unit 60b is given as a computer that typically has a CPU, a ROM, a RAM, and so forth similarly to the aforementioned control unit 60 of the first embodiment, and controls the individual units of the substrate processing apparatus 1b. The control unit 60b controls the laser oscillator 57b, rather than controlling the heating unit 55, the valve 52, and so forth, thereby controlling laser irradiation onto the wafer W.

With the substrate processing apparatus 1b and the method for manufacturing a semiconductor device of Modified Example 2, the laser is emitted through the irradiation nozzle 30b on the outer edge portion of the wafer W. This demonstrates effects same as those obtainable from the substrate processing apparatus 1 and the method for manufacturing a semiconductor device of the aforementioned the first embodiment.

Figure 13:
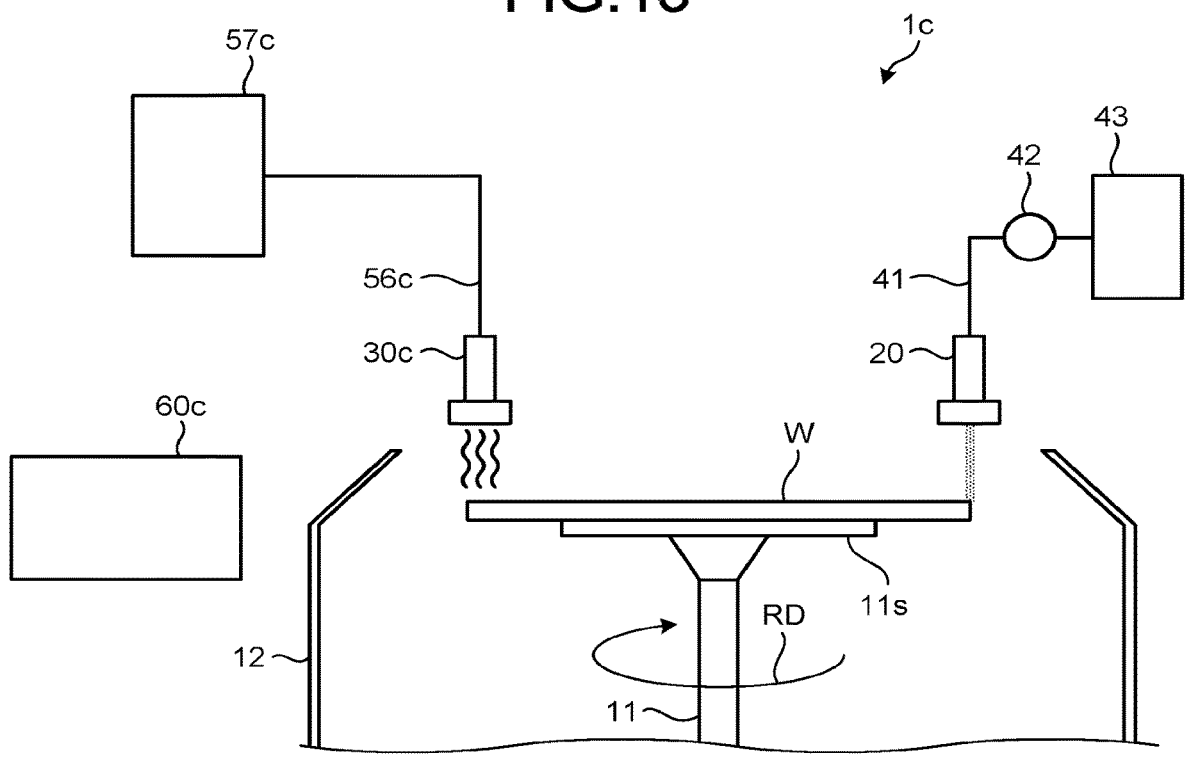
FIG. 13 is a drawing illustrating an exemplary structure of a substrate processing apparatus according to Modified Example 3 of the first embodiment.

FIG. 13 is a drawing illustrating an exemplary structure of a substrate processing apparatus 1c according to Modified Example 3 of the first embodiment. Note that, all structures in FIG. 13 same as those in FIG. 1 that illustrates the first embodiment will have same reference numerals, to skip the explanation.

As illustrated in FIG. 13, a substrate processing apparatus 1c of Modified Example 3 has a heater 30c, an electric wire 56c, a power source 57c, and a control unit 60c, in place of the gas nozzle 30, the feed tube 51, the valve 52, the gas tank 53, the gas reservoir 54, the heating unit 55, and the control unit 60 of the aforementioned the first embodiment.

The heater 30c as a solidified film forming unit is arranged above the outer edge portion of the wafer W that is supported by the turntable 11, and solidifies the chemical liquid applied to the outer edge portion of the wafer W, to form the solidified film that forms a part of the annular film.

Note that the heater 30c may alternatively be arranged below the outer edge portion of the wafer W that is supported on the turntable 11. Still alternatively, the heater 30c may be arranged both above and below the outer edge portion of the wafer W that is supported on the turntable 11.

The heater 30c is arranged on the downstream side in the direction of rotation RD of the wafer W, away from the position where the chemical liquid nozzle 20 is arranged. More specifically, the heater 30c is typically arranged within the range from 30° or larger to 330° or smaller away, and preferably within the range from 30° or larger to 180° or smaller away, in the circumferential direction of the wafer W, from the position where the chemical liquid nozzle 20 is disposed.

The heater 30c is connected through the electric wire 56c to the power source 57c. The heater 30c heats the outer edge portion of the wafer W, with use of the heater 30c, the electric wire 56c, and the power source 57c. The solvent contained in the chemical liquid applied to the outer edge portion thus vaporizes. This removes at least a part of the solvent in the chemical liquid, and allows the raw material in the chemical liquid to solidify to form the solidified film.

The control unit 60c is given as a computer that typically has a CPU, a ROM, a RAM, and so forth similarly to the aforementioned control unit 60 of the first embodiment, and controls the individual units of the substrate processing apparatus 1c. The control unit 60c controls the power source 57c to control heating of the outer edge portion of the wafer W, rather than controlling the heating unit 55, the valve 52, and so forth.

With the substrate processing apparatus 1c and the method for manufacturing a semiconductor device of Modified Example 3, the heater 30c heats the outer edge portion of the wafer W. This demonstrates effects same as those obtainable from the substrate processing apparatus 1 and the method for manufacturing a semiconductor device of the aforementioned the first embodiment.

Second Embodiment

Hereinafter, a second embodiment will be detailed referring to the attached drawings. The second embodiment is different from the first embodiment, in that the outer edge portion of the wafer is cooled.

Exemplary Structure of Substrate Processing Apparatus

Figure 14:
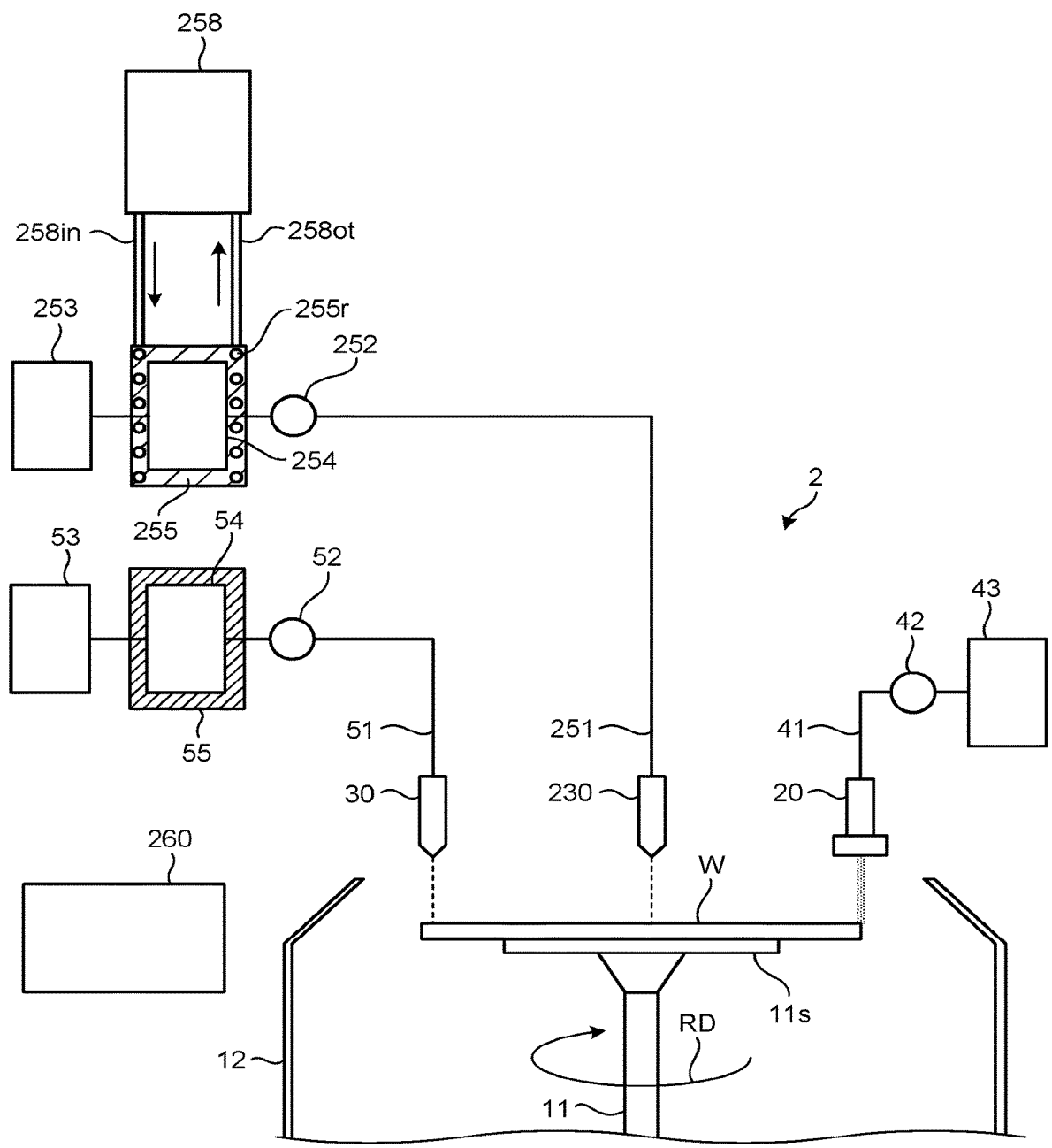
FIG. 14 is a drawing illustrating an exemplary structure of a substrate processing apparatus according to a second embodiment.

FIG. 14 is a drawing illustrating an exemplary structure of a substrate processing apparatus 2 according to the second embodiment. The substrate processing apparatus 2 of the second embodiment is given typically in the form of a chemical liquid application apparatus that forms the annular film on the outer edge portion of a wafer W. Note that, all structures in FIG. 14 same as those in FIG. 1 that illustrates the first embodiment will have same reference numerals, to skip the explanation.

The substrate processing apparatus 2 has, as illustrated in FIG. 14, a cooling nozzle 230, a feed tube 251, a valve 252, a gas tank 253, a gas reservoir 254, a refrigerant circulator 255, and a chiller 258, in addition to the structure of the substrate processing apparatus 1 of the aforementioned first embodiment. The substrate processing apparatus 2 also has a control unit 260, in place of the control unit 60 of the substrate processing apparatus 1 of the aforementioned first embodiment.

The cooling nozzle 230 as a cooling unit is arranged above the outer edge portion of the wafer W that is supported on the turntable 11, and cools the outer edge portion of the wafer W. The cooling nozzle 230 is arranged further on the downstream side in the direction of rotation RD of the wafer W, away from the position where the gas nozzle 30 is arranged.

With the gas nozzle 30 and the cooling nozzle 230 thus arranged, the cooling nozzle 230 on the downstream side of the gas nozzle 30 can cool the outer edge portion of the wafer W, after the gas nozzle 30 forms the solidified film on the outer edge portion of the wafer W that is kept rotated, and before the next coating film is formed on the solidified film. That is, the outer edge portion of the wafer W can be cooled typically down to an initial temperature, before the next coating film is formed on the solidified film ever heated.

Temperature of the outer edge portion of the wafer W affects formation of the coating film on the outer edge portion. For example, with the temperature of the outer edge portion of the wafer W kept high, the chemical liquid to be applied thereon will have the viscosity lowered, thereby thinning the coated film. Now with the outer edge portion of the wafer W kept at the initial temperature with use of the cooling nozzle 230, conditions for forming the coating film may be kept nearly constant, whereby the coated film is suppressed from having variable thickness.

The cooling nozzle 230 is connected to the downstream end of a feed tube 251 through which a predetermined gas is fed to the substrate processing apparatus 2. The feed tube 251 is provided with a valve 252, and also with the gas reservoir 254 on the upstream side of the valve 252. The upstream end of the feed tube 251 is connected to the gas tank 253.

The gas tank 253 is a supply source of the predetermined gas. The predetermined gas usable here may typically be an inert gas such as nitrogen gas, rare gases, or a mixed gas of some of these gases. The gas reservoir 254 can temporarily store the predetermined gas. Around the gas reservoir 254, there is provided a refrigerant circulator 255. The refrigerant circulator 255 is connected to the chiller 258, and cools the gas temporarily stored in the gas reservoir 254 to a predetermined temperature.

The refrigerant circulator 255 typically has a circulation channel 255r provided inside. One end of the circulation channel 255r in the refrigerant circulator 255 is connected through a chiller hose 258in to the chiller 258. The other end of the circulation channel 255r is connected through a chiller hose 258ot to the chiller 258.

The chiller 258 functions to cool the refrigerant to a predetermined temperature. The refrigerant cooled by the chiller 258 flows from the chiller 258 through the chiller hose 258in into the refrigerant circulator 255, and then flows from the refrigerant circulator 255 through the chiller hose 258ot back to the chiller 258. With the refrigerant circulated in the refrigerant circulator 255 while being cooled to a predetermined temperature by the chiller 258, the gas that is temporarily stored in the gas reservoir 254 is cooled to a predetermined temperature.

The cooled gas is ejected through the cooling nozzle 230 to the outer edge portion of the wafer W, with use of the cooling nozzle 230, the feed tube 251, the valve 252, the gas tank 253, the gas reservoir 254, the refrigerant circulator 255, and the chiller 258.

The control unit 260 is given in the form of a computer that typically has a CPU, a ROM, a RAM, and so forth similarly to the aforementioned control unit 60 of the first embodiment, and controls the individual units of the substrate processing apparatus 2 of the second embodiment. For example, the control unit 260 controls the valve 252 and the chiller 258, to control ejection of the cooling gas towards the wafer W.

The control unit 260 may also have an unillustrated storage unit that typically stores one or more recipes that contain various preset conditions for processing the wafer W. The recipe that represents the processing conditions may be managed on the aforementioned recipe table as illustrated in FIG. 5. In addition to the preset items in the aforementioned recipe table 61 in FIG. 5, the recipe of the second embodiment may further contain parameters such as ejection start timing, ejection end timing, cooling temperature, ejection volume of cooling gas, and gas species, as parameters regarding the cooling nozzle 230.

With such preset recipe managed on the recipe table, ejection of the heating gas through the gas nozzle 30 and ejection of the cooling gas through the cooling nozzle 230 can take place concurrently. That is, there is a period over which the ejection period of the heating gas through the gas nozzle 30 and the ejection period of the cooling gas through the cooling nozzle 230 overlap with each other. The ejection period of the heating gas through the gas nozzle 30 in this case may substantially coincide with the ejection period of the cooling gas through the cooling nozzle 230.

Alternatively, the length of the ejection period of the heating gas through the gas nozzle 30 may be nearly equal to the length of the ejection period of the cooling gas through the cooling nozzle 230, and, ejection of the cooling gas may start after the start of ejection of the heating gas, and ejection of the cooling gas may end after the end of ejection of the heating gas.

As a result of concurrence of ejection of the heating gas and ejection of the cooling gas, the outer edge portion of the wafer W is suppressed from causing cumulative elevation of temperature, even if the outer edge portion of the wafer W repetitively travels below the gas nozzle 30 as the wafer W rotates.

With the preset recipe managed on the recipe table, the cooling gas ejected through the cooling nozzle 230 is typically controlled to have a temperature possibly cooling the outer edge portion of the wafer W down to the initial temperature. More specifically, temperature of the cooling gas may be adjusted at around normal temperature, which is approximately about 23° C., for example.

Note that, in a case where the single-layer film is formed, the gas nozzle 30 is not used, similarly to the aforementioned first embodiment. In this case, also the cooling nozzle 230 may be disused, allowing the recipe table of the second embodiment to contain a recipe having no preset parameters regarding the cooling nozzle 230.

Figure 15:
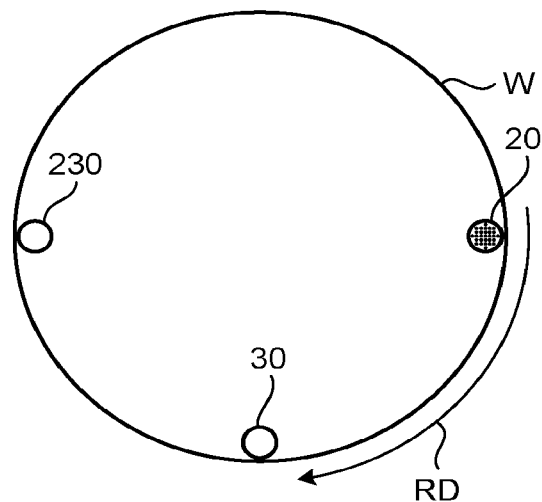
FIG. 15 is a plan view illustrating an arrangement of a chemical liquid nozzle, a gas nozzle, and a cooling nozzle equipped on the substrate processing apparatus according to the second embodiment.

FIG. 15 is a plan view illustrating an arrangement of the chemical liquid nozzle 20, the gas nozzle 30, and the cooling nozzle 230, equipped on the substrate processing apparatus 2 of the second embodiment. As illustrated in FIG. 15, the chemical liquid nozzle 20, the gas nozzle 30, and the cooling nozzle 230 are arranged a predetermined distance away from each other, in the circumferential direction of the wafer W.

More specifically, the cooling nozzle 230 is typically arranged within the range from 90° or larger to 270° or smaller away, in the circumferential direction of the wafer W, from the position where the chemical liquid nozzle 20 is arranged. The cooling nozzle 230 may also be arranged typically within the range from 60° or larger to 90° or smaller away, in the circumferential direction of the wafer W, from the position where the gas nozzle 30 is arranged.

In the example of FIG. 15, the gas nozzle 30 and the cooling nozzle 230 are arranged respectively 90° and 180° away, in the circumferential direction of the wafer W, from the position where the chemical liquid nozzle 20 is arranged. The cooling nozzle 230 is arranged 90° away, in the circumferential direction of the wafer W, from the position where the gas nozzle 30 is arranged.

With the gas nozzle 30 and the cooling nozzle 230 arranged a predetermined distance away from each other, the heated solidified film is prevented from being immediately cooled, instead allowing thorough removal of the solvent in the chemical liquid, and efficient formation of the solidified film. Hence, such an arrangement of the gas nozzle 30 and the cooling nozzle 230 makes it possible to suppress variation of thickness of the newly formed coating film, while efficiently forming the solidified film.

Summary

The substrate processing apparatus 2 of the second embodiment can demonstrate effects same as those obtainable from the substrate processing apparatus 1 of the aforementioned first embodiment.

The substrate processing apparatus 2 of the second embodiment has the cooling nozzle 230 that is arranged further on the downstream side in the direction of rotation RD of the wafer W, away from the position where the gas nozzle 30 is arranged, and ejects the cooled gas to the outer edge portion of the wafer W to cool the outer edge portion of the wafer W. Hence, the outer edge portion of the wafer W is suppressed from causing cumulative elevation of temperature, when using the gas nozzle 30, making it possible to form the annular film with a desired thickness in a precise manner.

In the substrate processing apparatus 2 of the second embodiment, the cooling nozzle 230 is arranged within the range of 90° or larger to 270° or smaller away, in the circumferential direction of the wafer W, from the position where the chemical liquid nozzle 20 is arranged. Such an arrangement of the cooling nozzle 230 makes it possible to suppress variation of thickness of the newly formed coating film, while efficiently forming the solidified film.

The method for manufacturing a semiconductor device of the second embodiment demonstrates effects same as those obtainable from the method for manufacturing a semiconductor device of the aforementioned first embodiment.

The semiconductor manufacturing method of the second embodiment cools the outer edge portion of the wafer W, further on the downstream side in the direction of rotation RD of the wafer W away from the position where the solidified film is formed, concurrently with the formation of the solidified film. As a result of concurrence of formation of the solidified film and cooling of the outer edge portion of the wafer W as described above, the outer edge portion of the wafer W is suppressed from causing cumulative elevation of temperature, making it possible to form the annular film with a desired thickness in a precise manner.

In the method for manufacturing a semiconductor of the second embodiment, the outer edge portion of the wafer W is cooled within the range from 90° or larger to 270° or smaller away, in the circumferential direction of the wafer W, from the position where the chemical liquid is applied. This makes it possible to suppress variations of film thickness of the newly formed coating film, while efficiently forming a solidified film.

Modified Examples 1 and 2

Next, structures of Modified Examples 1 and 2 of the second embodiment will be explained. Modified Examples 1 and 2 are different from the second embodiment, in the number of gas nozzles or cooling nozzles.

Also in the substrate processing apparatuses of Modified Examples 1 and 2, the chemical liquid nozzle, the gas nozzle, and the cooling nozzle are arranged a predetermined distance away from each other, in the circumferential direction of the wafer W. In addition, at least either the gas nozzle or the cooling nozzle may be arranged at multiple positions in the circumferential direction of the wafer W.

More specifically, a plurality of gas nozzles or a single gas nozzle is typically arranged within the range from 30° or larger to 330° or smaller away, and preferably within the range from 30° or larger to 180° or smaller away, in the circumferential direction of the wafer W, from the position where the chemical liquid nozzle is arranged.

Alternatively, a plurality of cooling nozzles or a single cooling nozzle is typically arranged within the range from 90° or larger to 270° or smaller away, in the circumferential direction of the wafer W, from the position where the chemical liquid nozzle is arranged. In addition, the cooling nozzle located on the most upstream side in the direction of rotation RD of the wafer W is arranged, for example, within the range from 60° or larger to 90° or smaller away, in the circumferential direction of the wafer W, from the position where the gas nozzle, which is adjacent to the cooling nozzle on the upstream side, is arranged.

Figure 16:
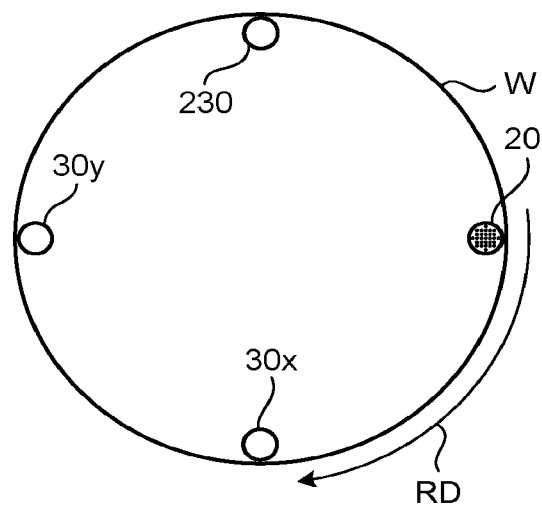
FIG. 16 is a plan view illustrating an arrangement of a chemical liquid nozzle, a gas nozzles, and a cooling nozzle equipped on a substrate processing apparatus according to Modified Example 1 of the second embodiment.
Figure 17:
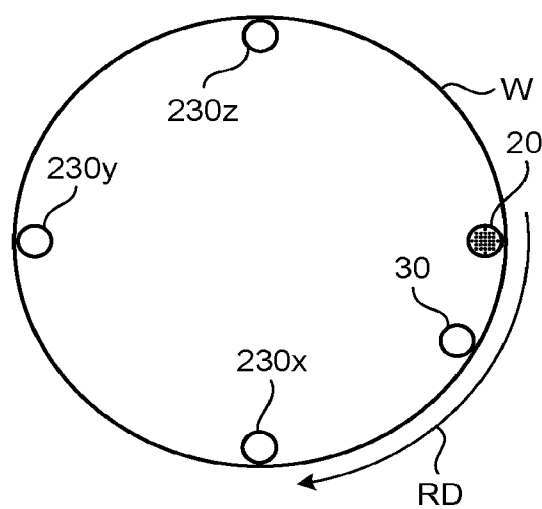
FIG. 17 is a plan view illustrating an arrangement of a chemical liquid nozzle, a gas nozzle, and a cooling nozzle equipped on a substrate processing apparatus according to Modified Example 2 of the second embodiment.

Here, an exemplary arrangement of a plurality of gas nozzles 30x and 30y is illustrated in FIG. 16, and an exemplary arrangement of a plurality of cooling nozzles 230x to 230z is illustrated in FIG. 17. Note, however, that the exemplary arrangements of the chemical liquid nozzle, the gas nozzles, and the cooling nozzles are not limited to those illustrated in FIGS. 16 and 17.

FIG. 16 is a plan view illustrating an arrangement of the chemical liquid nozzle 20, the gas nozzles 30x and 30y, and the cooling nozzle 230 equipped on the substrate processing apparatus according to Modified Example 1 of the second embodiment.

In the example illustrated in FIG. 16, there are arranged two gas nozzles 30x and 30y. In addition, the gas nozzle 30x, the gas nozzle 30y, and the cooling nozzle 230 are respectively arranged 90°, 180°, and 270° away, in the circumferential direction of the wafer W, from the position where the chemical liquid nozzle 20 is arranged. The cooling nozzle 230 is arranged 90° away, in the circumferential direction of the wafer W, from the position where the gas nozzle 30y is arranged.

The substrate processing apparatus of Modified Example 1 demonstrates effects same as those obtainable from the substrate processing apparatus 2 of the aforementioned second embodiment.

According to the substrate processing apparatus of Modified Example 1, the plurality of gas nozzles 30x and 30y are arranged in the circumferential direction of the wafer W. This makes it possible to more reliably remove the solvent from the solidified film.

The method for manufacturing the semiconductor device of Modified Example 1 demonstrates effects same as those obtainable from the method for manufacturing the semiconductor device of the aforementioned second embodiment.

According to the method for manufacturing a semiconductor device of Modified Example 1, the solidified film is formed by ejecting the heating gas at a plurality of positions within the range from 30° or larger to 330° or smaller away, in the circumferential direction of the wafer W, from the position where the chemical liquid is applied. This makes it possible to more reliably remove the solvent from the solidified film.

FIG. 17 is a plan view illustrating an arrangement of the chemical liquid nozzle 20, the gas nozzle 30, and the cooling nozzles 230x to 230z equipped on the substrate processing apparatus according to Modified Example 2 of the second embodiment.

In the example illustrated in FIG. 17, there are arranged three cooling nozzles 230x, 230y, and 230z. In addition, the gas nozzle 30, the cooling nozzle 230x, the cooling nozzle 230y, and the cooling nozzle 230z are respectively arranged 30°, 90°, 180°, and 270° away, in the circumferential direction of the wafer W, from the position where the chemical liquid nozzle 20 is arranged. The cooling nozzle 230x is arranged 60° away, in the circumferential direction of the wafer W, from the position where the gas nozzle 30 is arranged.

The substrate processing apparatus of Modified Example 2 demonstrates effects same as those obtainable from the substrate processing apparatus 2 of the aforementioned second embodiment.

The substrate processing apparatus of Modified Example 2 has the plurality of cooling nozzles 230x, 230y, and 230z arranged in the circumferential direction of the wafer W. This makes it possible to more reliably cool the outer edge portion of the wafer W.

The method for manufacturing the semiconductor device of Modified Example 2 demonstrates effects same as those obtainable from the method for manufacturing the semiconductor device of the aforementioned second embodiment.

According to the method for manufacturing the semiconductor device of Modified Example 2, cooling of the outer edge portion of the wafer W by ejection of the cooling gas takes place at a plurality of positions within the range from 90° or larger to 270° or smaller away, in the circumferential direction of the wafer W, from the position where the chemical liquid is applied. This makes it possible to more reliably cool the outer edge portion of the wafer W, while efficiently forming the solidified film.

Modified Example 3

Next, a substrate processing apparatus according to Modified Example 3 of the second embodiment will be explained. The substrate processing apparatus of Modified Example 3 is different from the substrate processing apparatus 2 of the second embodiment, in a method of cooling the outer edge portion of the wafer.

The substrate processing apparatus of Modified Example 3 has the refrigerant circulator, a chiller, and a chiller hose, in place of the cooling nozzle 230, the feed tube 251, the valve 252, the gas tank 253, the gas reservoir 254, the refrigerant circulator 255, and the chiller 258 of the aforementioned second embodiment.

The chiller of Modified Example 3 functions to cool the refrigerant to a predetermined temperature, similarly to the chiller 258 of the aforementioned second embodiment. The chiller hose of the Modified Example 3 allows therein circulation of the refrigerant from the chiller of Modified Example 3 to the refrigerant circulator of Modified Example 3.

The refrigerant circulator of Modified Example 3 as a cooling unit is arranged in the vicinity at least either above or below the outer edge portion of the wafer that is supported by the turntable. The refrigerant circulator of Modified Example 3 is arranged further on the downstream side in the direction of rotation of the wafer, away from the position where the gas nozzle is arranged.

As described above, the refrigerant cooled to the predetermined temperature by the chiller of Modified Example 3 circulates in the refrigerant circulator of Modified Example 3, whereby the outer edge portion of the wafer having the heated solidified film is cooled.

The substrate processing apparatus of Modified Example 3 has a refrigerant circulator that is arranged at least either above or below the outer edge portion of the wafer that is supported on the turntable, further on the downstream side in the direction of rotation of the wafer, away from the position where the gas nozzle that ejects the heating gas is arranged, and cools the outer edge portion of the wafer. This demonstrates effects same as those obtainable from the substrate processing apparatus 2 of the aforementioned second embodiment.

The method for manufacturing the semiconductor device of Modified Example 3 cools the outer edge portion of the wafer, further on the downstream side in the direction of rotation of the wafer, away from the position where the solidified film is formed, concurrently with formation of the solidified film. This demonstrates effects same as those obtainable from the method for manufacturing the semiconductor device of the aforementioned second embodiment.

Other Embodiments

The aforementioned first and second embodiments and Modified Examples 1 to 3 used the chemical liquid that contains a resist material, and formed the resist film as the annular film FL. Material of the annular film FL has, however, a wide range of choice, typically depending on material of the mask pattern used when the wafer W is etched.

The substrate processing apparatus may be capable of forming a spin on carbon (SOC) film as the annular film, typically with use of a chemical liquid that contains an SOC material. The SOC film is an organic film similar to the resist film or the like, and has an etching characteristic such as etching selectivity equivalent to that of the resist film. The SOC film is also removable by asking with use of oxygen plasma or the like. Hence, the SOC film is employable as a film for protecting the outer edge portion of the wafer W, typically when a fine pattern is formed in the central part of the wafer W, by using an organic mask pattern such as the resist pattern.

The substrate processing apparatus may alternatively be capable of forming a spin on glass (SOG) film as the annular film, typically with use of a chemical liquid that contains an SOG material. The SOG film is an inorganic film similar to a silicon oxide film or the like, and has an etching characteristic such as etching selectivity equivalent to that of silicon oxide film or the like. Hence, the SOG film is employable as a film for protecting the outer edge portion of the wafer W, typically when a fine pattern is formed in the central part of the wafer W, by using a hard mask pattern such as a silicon oxide pattern or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus for forming an annular film on an outer edge portion of a substrate, the substrate processing apparatus comprising:
    a rotation support table capable of supporting and rotating the substrate;
    a chemical liquid nozzle that is arranged above the outer edge portion of the substrate that is supported by the rotation support table, and through which a chemical liquid is applied to the outer edge portion; and
    a solidified film forming unit that is arranged at least either on an upper side or on a lower side of the outer edge portion of the substrate that is supported by the rotation support table, and on a downstream side, of a position, in a direction of rotation of the substrate, where the chemical liquid nozzle is arranged, the solid film-forming unit solidifying the chemical liquid applied to the outer edge portion, to form a solidified film that forms a part of the annular film,
    wherein
    the chemical liquid nozzle has a plurality of ejection orifices individually arranged in a circular region so as to form a lattice pattern or a concentric pattern, through which the chemical liquid is ejected simultaneously.

2. The substrate processing apparatus according to claim 1, wherein the solidified film forming unit is at least one of:
    a gas nozzle that ejects a heated gas towards the outer edge portion;

an irradiation nozzle that irradiates the outer edge portion with a laser; and
a heater that heats the outer edge portion.

* * * * *